US011515286B2

(12) United States Patent
Bajwa et al.

(10) Patent No.: US 11,515,286 B2
(45) Date of Patent: *Nov. 29, 2022

(54) METHODS OF BONDING OF SEMICONDUCTOR ELEMENTS TO SUBSTRATES, AND RELATED BONDING SYSTEMS

(71) Applicant: Kulicke and Soffa Industries, Inc., Fort Washington, PA (US)

(72) Inventors: Adeel Ahmad Bajwa, Blue Bell, PA (US); Thomas J. Colosimo, Jr., West Chester, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 53 days.

This patent is subject to a terminal disclaimer.

(21) Appl. No.: 17/317,478

(22) Filed: May 11, 2021

(65) Prior Publication Data

US 2021/0265303 A1 Aug. 26, 2021

Related U.S. Application Data

(63) Continuation-in-part of application No. 16/736,416, filed on Jan. 7, 2020, now Pat. No. 11,205,633.
(Continued)

(51) Int. Cl.
*H01L 21/40* (2006.01)
*H01L 23/00* (2006.01)

(52) U.S. Cl.
CPC .............. *H01L 24/81* (2013.01); *H01L 24/75* (2013.01); *H01L 2224/7565* (2013.01);
(Continued)

(58) Field of Classification Search
CPC ............. H01L 24/75; H01L 24/81; H01L 2224/81203; H01L 2224/81205; H01L 2224/81801; H01L 2224/75102
(Continued)

(56) References Cited

U.S. PATENT DOCUMENTS 6,666,369 B2 * 12/2003 Matsuki ................ H01L 24/13
228/202
6,732,911 B2 * 5/2004 Matsuki ................ B23K 1/008
228/19

(Continued)

FOREIGN PATENT DOCUMENTS

JP 2000349102 12/2000
JP 2013-251404 12/2013
(Continued)

OTHER PUBLICATIONS

International Search Report dated Apr. 29, 2020 for International Patent Application No. PCT/US2020/012690.

*Primary Examiner* — Vu A Vu
(74) *Attorney, Agent, or Firm* — Christopher M. Spletzer, Sr.

(57) ABSTRACT

A bonding system for bonding a semiconductor element to a substrate is provided. The bonding system includes a substrate oxide reduction chamber configured to receive a substrate. The substrate includes a plurality of first electrically conductive structures. The substrate oxide reduction chamber is configured to receive a reducing gas to contact each of the plurality of first electrically conductive structures. The bonding system also includes a substrate oxide prevention chamber for receiving the substrate after the reducing gas contacts the plurality of first electrically conductive structures. The substrate oxide prevention chamber has an inert environment when receiving the substrate. The bonding system also includes a reducing gas delivery system for providing a reducing gas environment during bonding of a semiconductor element to the substrate.

28 Claims, 36 Drawing Sheets

Related U.S. Application Data

(60) Provisional application No. 62/907,562, filed on Sep. 28, 2019, provisional application No. 62/790,259, filed on Jan. 9, 2019.

(52) U.S. Cl.
CPC ............... *H01L 2224/75101* (2013.01); *H01L 2224/75301* (2013.01); *H01L 2224/81065* (2013.01); *H01L 2224/81075* (2013.01); *H01L 2224/81201* (2013.01)

(58) Field of Classification Search
USPC ........................................................ 438/455
See application file for complete search history.

(56) References Cited

U.S. PATENT DOCUMENTS

| | | | |
|---|---|---|---|
| 7,332,424 B2 | 2/2008 | Bélanger et al. | |
| 7,648,901 B2 | 1/2010 | Tu et al. | |
| 8,864,011 B2 | 10/2014 | Abe | |
| 9,282,650 B2 | 3/2016 | Dhavaleswarapu et al. | |
| 9,418,961 B2 | 8/2016 | Yu et al. | |
| 11,205,633 B2 * | 12/2021 | Bajwa | H01L 24/81 |
| 2002/0130164 A1 | 9/2002 | Matsuki et al. | |
| 2006/0016555 A1 | 1/2006 | Yamauchi et al. | |
| 2008/0188070 A1 | 8/2008 | Johnson et al. | |
| 2009/0142903 A1 | 6/2009 | Yu et al. | |
| 2009/0313816 A1 | 12/2009 | Cavazza | |
| 2010/0084438 A1 | 4/2010 | Biggs et al. | |
| 2010/0089978 A1 | 4/2010 | Hughlett et al. | |
| 2011/0045653 A1 | 2/2011 | Ohno et al. | |
| 2011/0198388 A1 | 8/2011 | Zhang | |
| 2012/0104076 A1 | 5/2012 | Suga et al. | |
| 2013/0181040 A1 | 7/2013 | Watanabe et al. | |
| 2015/0048523 A1 | 2/2015 | Suga et al. | |
| 2017/0271145 A1 | 9/2017 | Dietze et al. | |
| 2018/0326545 A1 | 11/2018 | Hayashi et al. | |
| 2019/0252349 A1 | 8/2019 | Bajwa | |

FOREIGN PATENT DOCUMENTS

| | | |
|---|---|---|
| KR | 10-2013-0083400 | 7/2013 |
| WO | WO2012166911 A2 | 12/2012 |

* cited by examiner

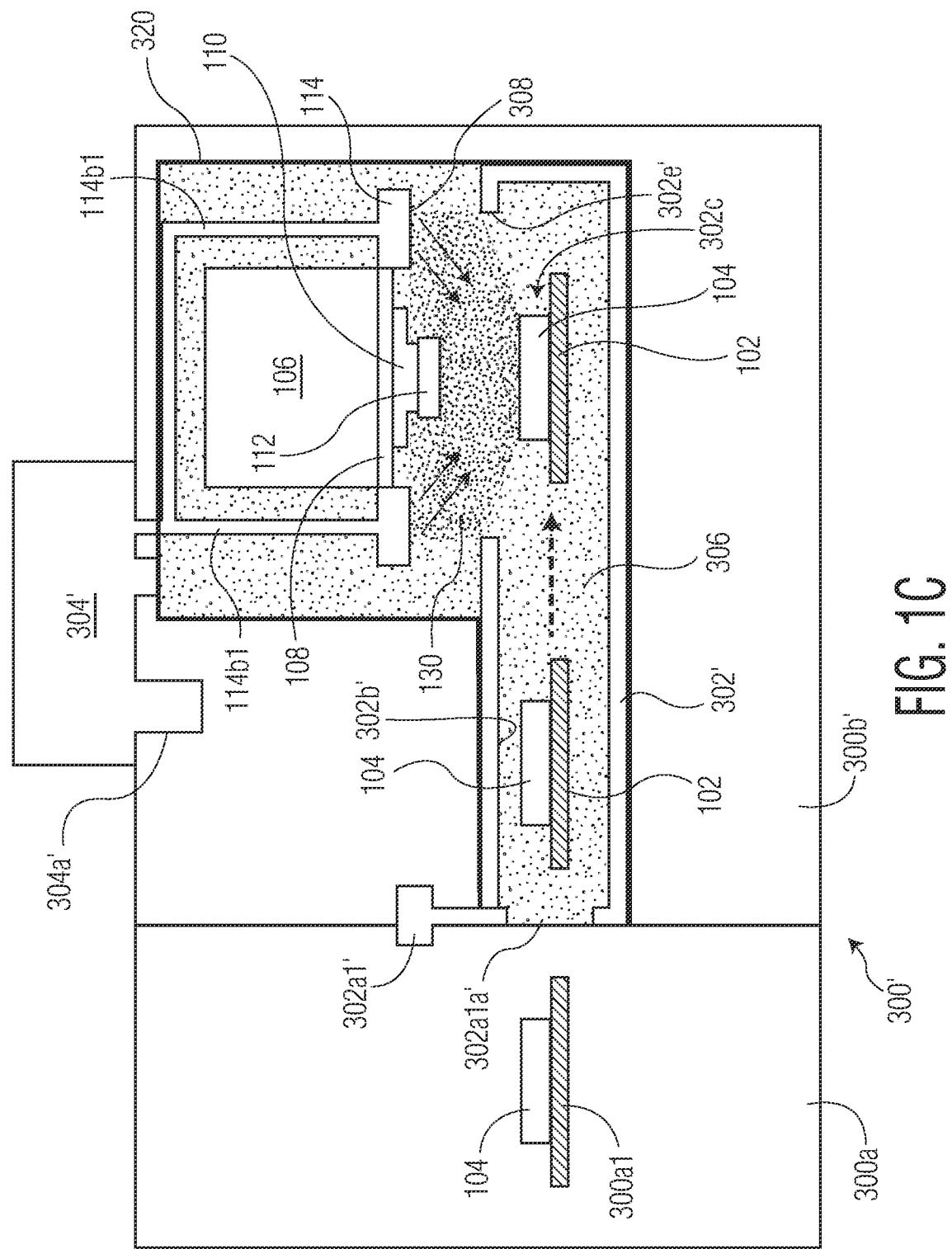

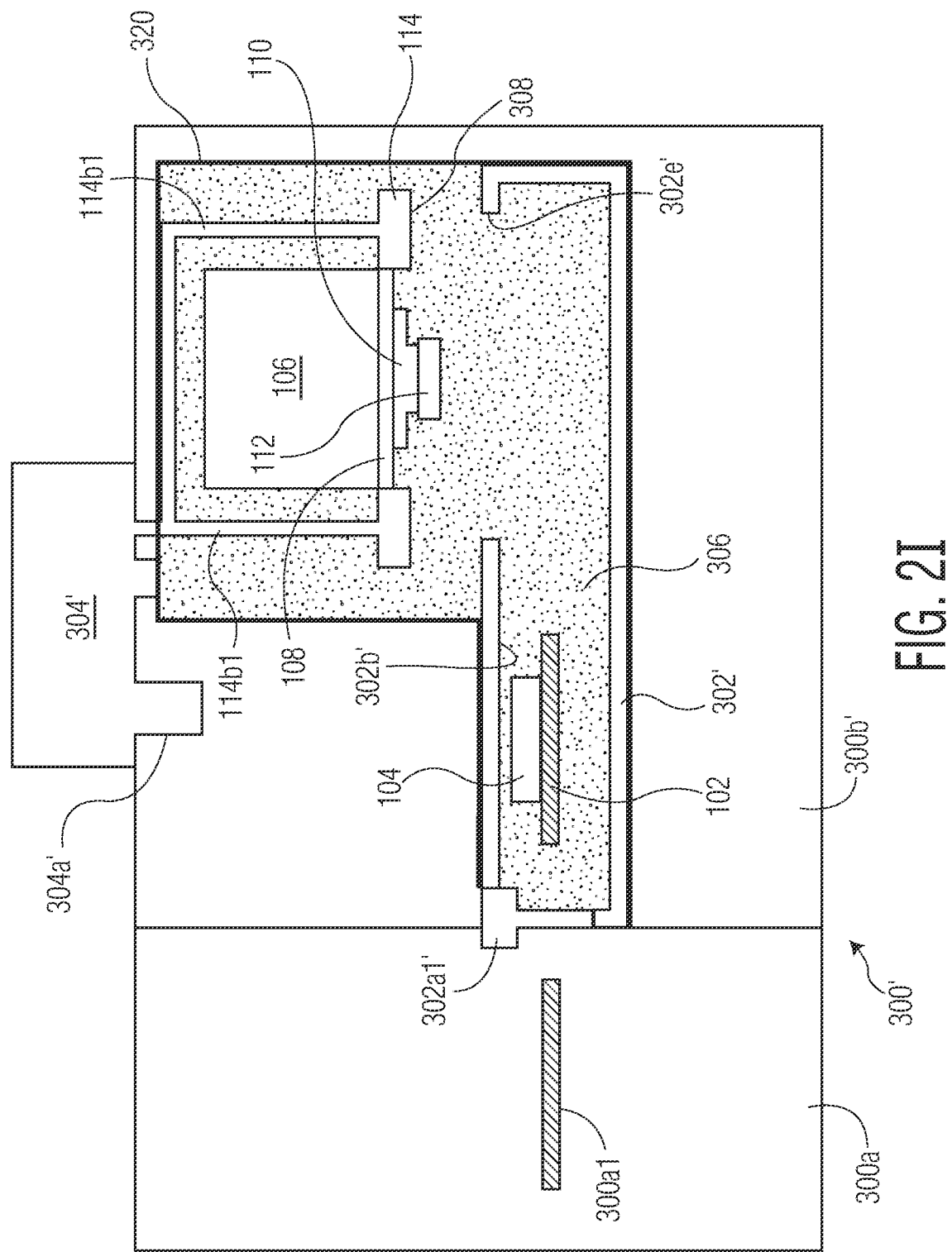

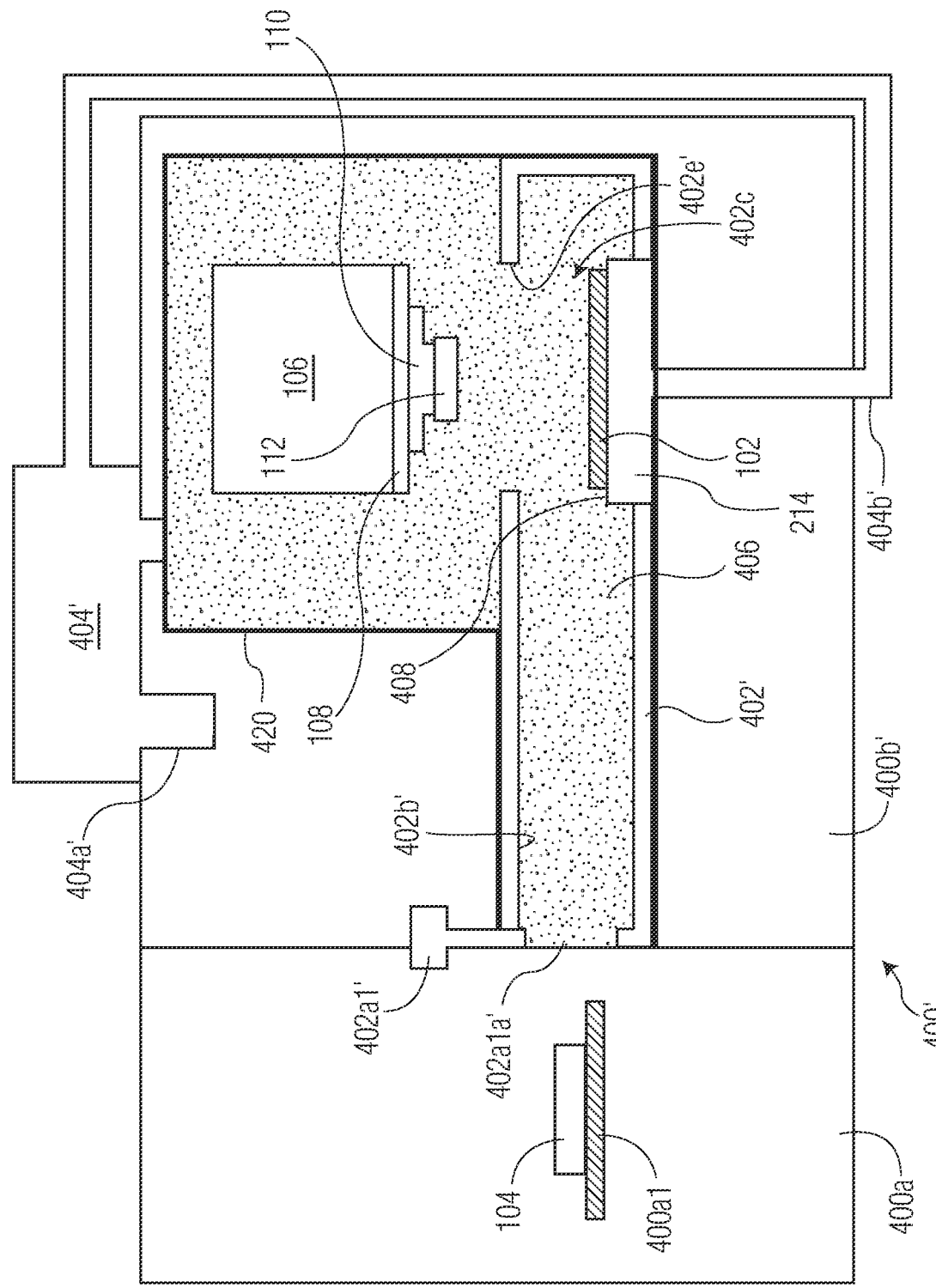

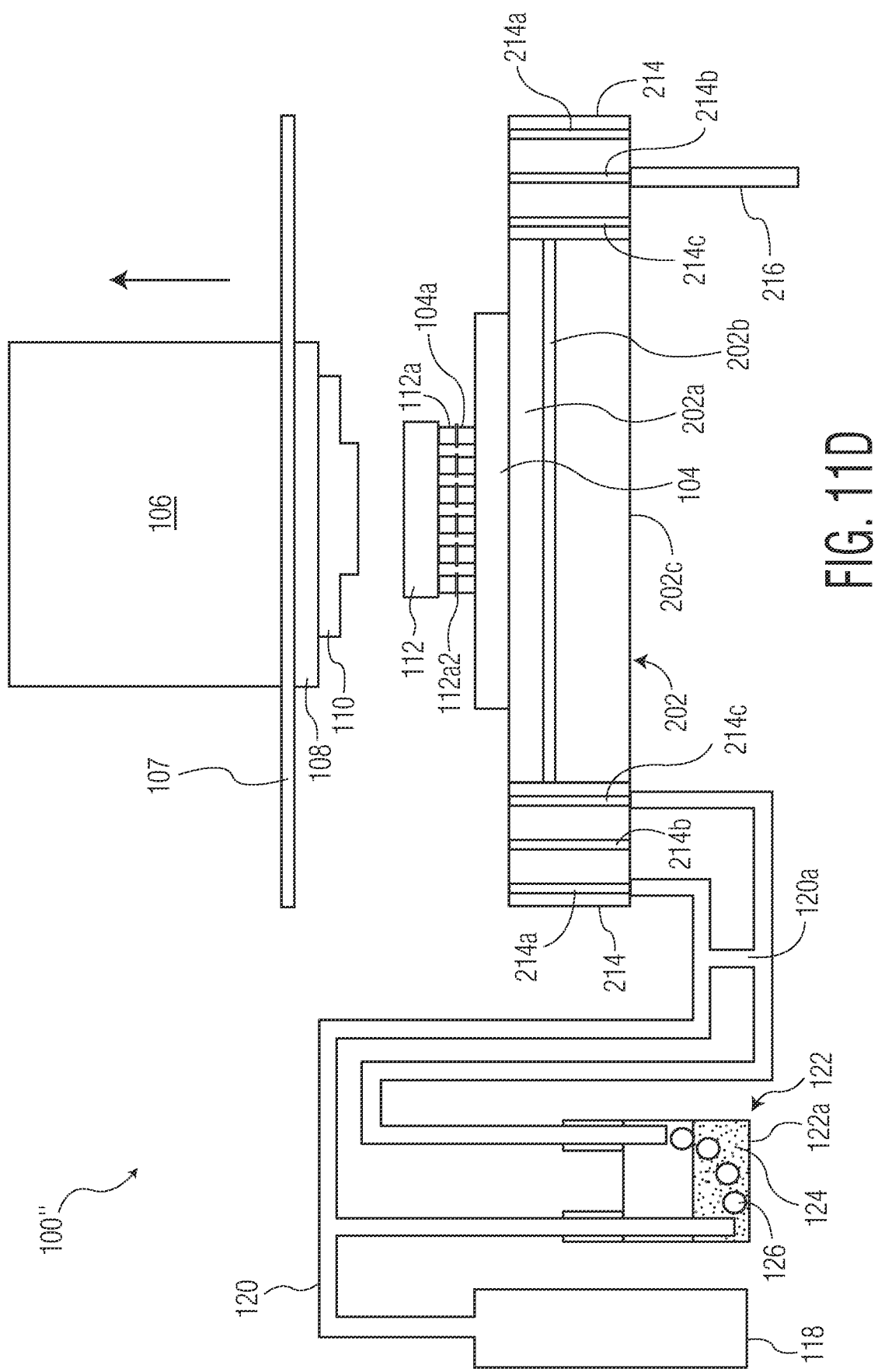

METHODS OF BONDING OF SEMICONDUCTOR ELEMENTS TO SUBSTRATES, AND RELATED BONDING SYSTEMS

CROSS-REFERENCE TO RELATED APPLICATIONS

This application is a continuation-in-part application of U.S. patent application Ser. No. 16/736,416, filed on Jan. 7, 2020, which claims the benefit of U.S. Provisional Application No. 62/790,259, filed Jan. 9, 2019, and of U.S. Provisional Application No. 62/907,562, filed Sep. 28, 2019, the contents of both of which are incorporated herein by reference.

FIELD

The invention relates to bonding systems and processes (such as flip chip, thermocompression, and thermosonic bonding systems and processes), and more particularly, to improved systems and methods for bonding a semiconductor element to a substrate.

BACKGROUND

Traditional semiconductor packaging typically involves die attach processes and wire bonding processes. Advanced semiconductor packaging technologies (e.g., flip chip bonding, thermocompression bonding, etc.) continue to gain traction in the industry. For example, in thermocompression bonding (i.e., TCB), heat and/or pressure (and sometimes ultrasonic energy) are used to form a plurality of interconnections between (i) electrically conductive structures on a semiconductor element and (ii) electrically conductive structures on a substrate.

In certain flip chip bonding or thermocompression bonding applications, the electrically conductive structures of the semiconductor element and/or the substrate may include copper structures (e.g., copper pillars) or other material(s) that is subject to oxidation and/or other contamination. In such applications, it is desirable to provide an environment suitable for bonding. Conventionally, such an environment may be provided by using a reducing gas at the bonding area to reduce potential oxidation and/or contamination of the electrically conductive structures of the semiconductor element or the substrate to which it will be bonded.

Thus, it would be desirable to provide improved methods of bonding semiconductor elements to a substrate with the use of a reducing gas.

SUMMARY

According to an exemplary embodiment of the invention, a bonding system for bonding a semiconductor element to a substrate is provided. The bonding system includes a substrate oxide reduction chamber configured to receive a substrate. The substrate includes a plurality of first electrically conductive structures. The substrate oxide reduction chamber is configured to receive a reducing gas to contact each of the plurality of first electrically conductive structures. The bonding system also includes a substrate oxide prevention chamber for receiving the substrate after the reducing gas contacts the plurality of first electrically conductive structures. The substrate oxide prevention chamber has an inert environment when receiving the substrate. The bonding system also includes a reducing gas delivery system for providing a reducing gas environment during bonding of a semiconductor element to the substrate. The semiconductor element includes a plurality of second electrically conductive structures. The plurality of first electrically conductive structures are configured to be bonded with corresponding ones of the plurality of second electrically conductive structures.

According to another exemplary embodiment of the invention, a bonding system for bonding a semiconductor element to a substrate is provided. The bonding system includes a substrate oxide prevention chamber configured to receive a substrate. The substrate includes a plurality of first electrically conductive structures. The substrate oxide prevention chamber has an inert environment when receiving the substrate. The bonding system also includes a reducing gas delivery system for providing a reducing gas environment during bonding of a semiconductor element to the substrate. The semiconductor element includes a plurality of second electrically conductive structures. The plurality of first electrically conductive structures are configured to be bonded with corresponding ones of the plurality of second electrically conductive structures.

According to yet another exemplary embodiment of the invention, a method of bonding a semiconductor element to a substrate is provided. The method includes the steps of: moving a substrate into a substrate oxide reduction chamber, the substrate including a plurality of first electrically conductive structures, the substrate oxide reduction chamber configured to receive a reducing gas to contact each of the plurality of first electrically conductive structures; moving the substrate into a substrate oxide prevention chamber after the reducing gas contacts the plurality of first electrically conductive structures, the substrate oxide prevention chamber having an inert environment when receiving the substrate; and providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures.

According to yet another exemplary embodiment of the invention, a method of bonding a semiconductor element to a substrate is provided. The method includes the steps of: moving a substrate into a substrate oxide prevention chamber, the substrate including a plurality of first electrically conductive structures, the substrate oxide prevention chamber having an inert environment when receiving the substrate; and providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures.

According to yet another exemplary embodiment of the invention, a method of bonding a semiconductor element to a substrate is provided. The method includes the steps of: (a) carrying a semiconductor element with a bonding tool of a bonding machine, the semiconductor element including a plurality of first electrically conductive structures; (b) supporting a substrate with a support structure of the bonding machine, the substrate including a plurality of second electrically conductive structures; (c) providing a reducing gas in contact with each of the plurality of first electrically conductive structures and the plurality of second electrically conductive structures; and (d) bonding the corresponding ones of the plurality of first electrically conductive structures to the respective ones of the plurality of second electrically conductive structures after step (c). At least one of the plurality of first electrically conductive structures and the plurality of second electrically conductive structures includes a solder material.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

FIG. 1C is a block diagram illustration of yet another bonding system for bonding a semiconductor element to a substrate in accordance with an exemplary embodiment of the invention;

FIGS. 11A-11D are a series of block diagram illustrations of another bonding system, illustrating a method of bonding a semiconductor element to a substrate in accordance with an exemplary embodiment of the invention.

DETAILED DESCRIPTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

In accordance with certain exemplary embodiments of the invention, a fluxless bonding system is provided using reducing gas/gases. The bonding system may be, for example, a flip chip bonding system, a thermocompression bonding system, a thermosonic bonding system, etc.

Aspects of the invention relate to a novel fluxless chip-to-substrate or chip-to-wafer system that avoids oxidation of metal and solder pads during bonding (e.g., during thermocompression bonding).

Exemplary systems include a "substrate oxide reduction chamber" (also referred to as a substrate cleaning compartment), a "substrate oxide prevention chamber" (also referred to as a substrate protection compartment), and a "reducing gas delivery system" (e.g., a localized chip and substrate oxide reduction bond head shroud, or other reducing gas delivery system) to eliminate the use of a fluxing process.

Figure 1A:
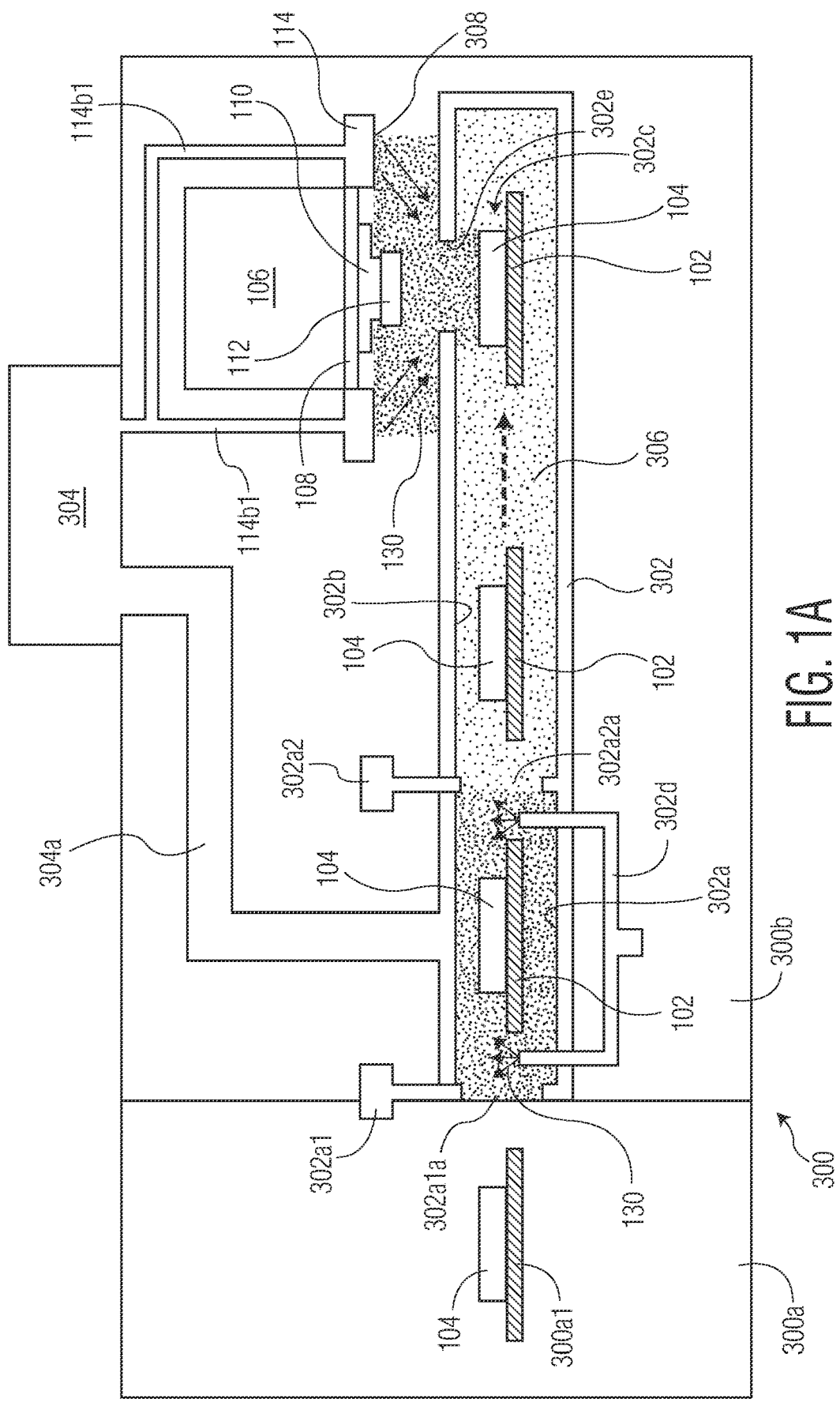
FIG. 1A is a block diagram illustration of a bonding system for bonding a semiconductor element to a substrate in accordance with an exemplary embodiment of the invention.

FIG. 1A illustrates exemplary bonding system 300. Bonding system 300 includes: a substrate source 300a (e.g., a wafer handler or other source) for providing a substrate(s) 104 (such as a wafer, a printed circuit board, etc.) on a support structure 300a1; and a processing system 300b. Substrate 104 is configured to be transferred to processing system 300b (e.g., including a tunnel 302, but may be a different type of structure). Tunnel 302 (or other structure, as desired) includes a substrate oxide reduction chamber 302a, a substrate oxide prevention chamber 302b, and a bonding location 302c (which is part of substrate oxide prevention chamber 302b). A reducing gas delivery system 308 is also included in processing system 300b.

In the example shown in FIG. 1A, because tunnel 302 includes both substrate oxide reduction chamber 302a and a substrate oxide prevention chamber 302b, at least a portion of substrate oxide reduction chamber 302a has a common boundary with substrate oxide prevention chamber 302b. Substrate oxide reduction chamber 302a is closed using entry door 302a1 (which closes opening 302a1a) and exit door 302a2 (which closes opening 302a2a). Another reducing gas delivery system 302d (which may be interconnected with reducing gas delivery system 308 to use a common source of reducing gas) is provided to provide a reducing gas (e.g., formic acid vapor) in substrate oxide reduction chamber 302a. After processing (e.g., removal of oxides from conductive structures of substrate 104) in substrate oxide reduction chamber 302a, a substrate transfer system (which may be part of a material handling system including support structure 102) is used to transfer substrate 104 through exit door 302a2 to substrate oxide prevention chamber 302b. Substrate oxide prevention chamber 302b includes an inert environment 306 (e.g., through a nitrogen supply, not shown for simplicity). A material handling system (e.g., including support structure 102) is used to move substrate 104 within substrate oxide prevention chamber 302b to a bonding location 302c. While at bonding location 302c, a reducing gas 130 is provided by reducing gas delivery system 308.

FIG. 1A also illustrates bond head assembly 106, including heater 108, and bonding tool 110. FIG. 1A also illustrates main exhaust 304 which pulls exhaust gases (e.g., gases such as reducing gas vapors) through piping 304a and 114b1 (where piping 114b1 is coupled, directly or indirectly, to center channel 114b described below). Bond head assembly 106 carries a bond head manifold 114 for receiving and distributing fluids (e.g., gases, vapors, etc.) as desired in the given application. Details of an exemplary bond head assembly 106, including exemplary bond head manifold 114, are described below in connection with FIGS. 4-9, and FIGS. 10A-10D.

In connection with a bonding operation, semiconductor element 112 (which is carried by bond head assembly 106 into tunnel 302 through opening 302e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas is a saturated vapor gas) in the area of semiconductor element 112 and substrate 104 in connection with a bonding operation (in the illustrated example, reducing gas 130 is able to enter tunnel 302 through opening 302e). After reducing gas 130 is distributed in the area of semiconductor element 112 and substrate 104, reducing gas 130 contacts surfaces of each of electrically conductive structures of semiconductor element 112 and substrate 104.

Figure 1B:
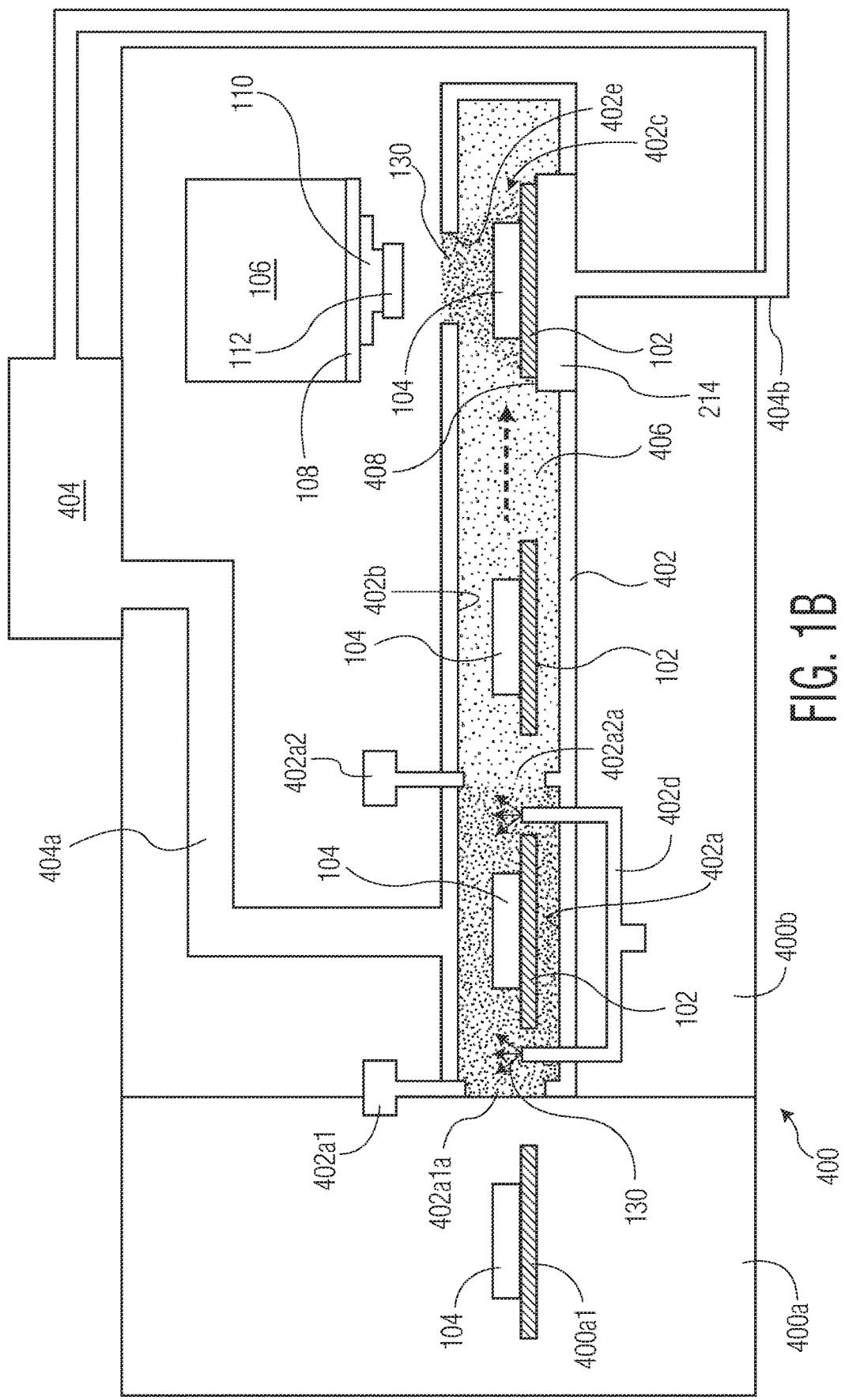
FIG. 1B is a block diagram illustration of another bonding system for bonding a semiconductor element to a substrate in accordance with an exemplary embodiment of the invention.

FIG. 1B illustrates exemplary bonding system 400, which is similar in many respect to bonding system 300 of FIG. 1A (where like elements have the same reference numerals, or a numeral beginning with a "4" instead of a "3"). Bonding system 400 includes a substrate source 400a (e.g., a wafer handler or other source) for providing a substrate(s) 104 (such as a wafer, a printed circuit board, etc.) on a support structure 400a1. Substrate 104 is configured to be transferred to processing system 400b (e.g., including a tunnel 402, but may be a different type of structure). Tunnel 402 (or other structure, as desired) includes a substrate oxide reduction chamber 402a, a substrate oxide prevention chamber 402b, and a bonding location 402c (which is part of substrate oxide prevention chamber 402b).

In the example shown in FIG. 1B, because tunnel 402 includes both substrate oxide reduction chamber 402a and a substrate oxide prevention chamber 402b, at least a portion of substrate oxide reduction chamber 402a has a common boundary with substrate oxide prevention chamber 402b. A reducing gas delivery system 408 is also included in processing system 400b. Substrate oxide reduction chamber 402a is closed using entry door 402a1 (which closes opening 402a1a) and exit door 402a2 (which closes opening 402a2a). Another reducing gas delivery system 402d (which may be interconnected with reducing gas delivery system 408 to use a common source of reducing gas) is provided to provide a reducing gas (e.g., formic acid vapor) in substrate oxide reduction chamber 402a. After processing (e.g., removal of oxides from conductive structures of substrate 104) in substrate oxide reduction chamber 402a, a substrate transfer system (which may be part of a material handling system including support structure 102) is used to transfer substrate 104 through opening 402a2a to substrate oxide prevention chamber 402b. Substrate oxide prevention chamber 402b includes an inert environment 406 (e.g., through a nitrogen supply, not shown for simplicity). A material handling system (e.g., including support structure 102) is used to move substrate 104 within substrate oxide prevention chamber 402b to a bonding location 402c. While at bonding location 402c, a reducing gas 130 is provided by reducing gas delivery system 408.

FIG. 1B also illustrates bond head assembly 106, including heater 108, and bonding tool 110. FIG. 1B also illustrates main exhaust 404 which pulls exhaust gases (e.g., gases such as reducing gas vapors) through piping 404a and 404b. A manifold 214 is provided for receiving and distributing fluids (e.g., gases, vapors, etc.) as desired in the given application. Details of an exemplary bond head assembly 106, and an exemplary manifold 214, are described below in connection with FIGS. 11A-11D).

In connection with a bonding operation, semiconductor element 112 (which is carried by bond head assembly 106 into tunnel 402 through opening 402e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Manifold 214 provides a reducing gas 130 (e.g., where the reducing gas is a saturated vapor gas) in the area of semiconductor element 112 and substrate 104 in connection with a bonding operation. After reducing gas 130 is distributed in the area of semiconductor element 112 and substrate 104, reducing gas 130 contacts surfaces of each of electrically conductive structures of semiconductor element 112 and substrate 104.

Figure 1D:
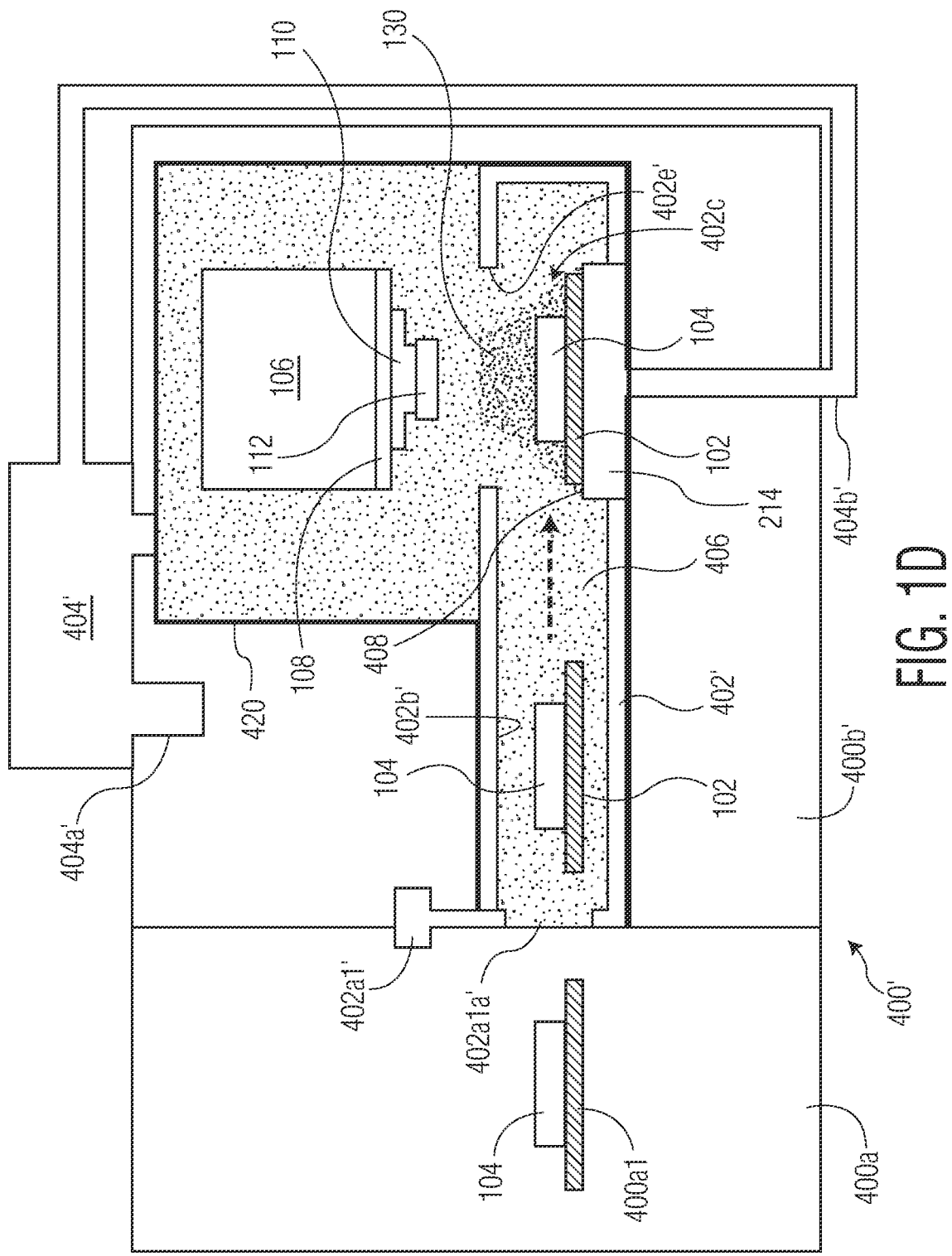
FIG. 1D is a block diagram illustration of yet another bonding system for bonding a semiconductor element to a substrate in accordance with an exemplary embodiment of the invention.

While exemplary bonding systems of FIGS. 1A-1B include substrate oxide reduction chamber 302a, 402a and associated structures, it is contemplated that simplified systems without substrate oxide reduction chamber 302a, 402a and associated structures, are within the scope of the invention, such as the systems of FIGS. 1C-1D and the processes of FIGS. 2H-2P.

FIG. 1C illustrates exemplary bonding system 300'. Bonding system 300' includes: a substrate source 300a (e.g., a wafer handler or other source) for providing a substrate(s) 104 (such as a wafer, a printed circuit board, etc.) on a support structure 300a1; and a processing system 300b'. Substrate 104 is configured to be transferred to processing system 300b' (e.g., including an inner environment chamber 320, including a tunnel 302', but may be a different type of structure). Tunnel 302' (or other structure, as desired) includes a substrate oxide prevention chamber 302b' and a bonding location 302c (which is part of substrate oxide prevention chamber 302b'). A reducing gas delivery system 308 is also included in processing system 300b'. Within processing system 300b' (sometimes referred herein as main machine compartment), inner environment chamber 320 may include at least a portion of the substrate oxide prevention chamber 302b' and the reducing gas delivery system 308.

In the example shown in FIG. 1C, tunnel 302' includes entry door 302a1' (which closes opening 302a1a'). A substrate transfer system (which may be part of a material handling system including support structure 102) is used to transfer substrate 104 through entry door 302a1' to substrate oxide prevention chamber 302b'. Substrate oxide prevention chamber 302b' includes an inert environment 306 (e.g., through a nitrogen supply, not shown for simplicity). A material handling system (e.g., including support structure 102) is used to move substrate 104 within substrate oxide prevention chamber 302b' to a bonding location 302c. While at bonding location 302c, a reducing gas 130 is provided by reducing gas delivery system 308.

FIG. 1C also illustrates bond head assembly 106, including heater 108, and bonding tool 110. FIG. 1C also illustrates main exhaust 304' which pulls exhaust gases (e.g., gases such as reducing gas vapors) from the processing area 300b' (sometimes referred to as the main machine compartment) or the inner environment chamber 320 through piping 304a' and 114b1 (where piping 114b1 is coupled, directly or indirectly, to center channel 114b described below). Bond head assembly 106 carries a bond head manifold 114 for receiving and distributing fluids (e.g., gases, vapors, etc.) as desired in the given application. Details of an exemplary bond head assembly 106, including exemplary bond head manifold 114, are described below in connection with FIGS. 4-9, and FIGS. 10A-10D.

In connection with a bonding operation, semiconductor element 112 (which is carried by bond head assembly 106 into tunnel 302' through opening 302e') is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas is a saturated vapor gas) in the area of semiconductor element 112 and substrate 104 in connection with a bonding operation (in the illustrated example, reducing gas 130 is able to enter tunnel 302' through opening 302e'). After reducing gas 130 is distributed in the area of semiconductor element 112 and substrate 104, reducing gas 130 contacts surfaces of each of electrically conductive structures of semiconductor element 112 and substrate 104.

FIG. 1D illustrates exemplary bonding system 400', which is similar in many respects to bonding system 300' of FIG. 1C (where like elements have the same reference numerals, or a numeral beginning with a "4" instead of a "3"). Bonding system 400' includes a substrate source 400a (e.g., a wafer handler or other source) for providing a substrate(s) 104 (such as a wafer, a printed circuit board, etc.) on a support structure 400a1. Substrate 104 is configured to be transferred to a processing system 400b' (e.g., including an inner environment chamber 420, including a tunnel 402', but may be a different type of structure). Tunnel 402' (or other structure, as desired) includes a substrate oxide prevention chamber 402b' and a bonding location 402c (which is part of substrate oxide prevention chamber 402b'). Within processing system 400b' (sometimes referred herein as main machine compartment), inner environment chamber 420 may include at least a portion of the substrate oxide prevention chamber 402b' and the reducing gas delivery system 408.

In the example shown in FIG. 1D, tunnel 402' includes a substrate oxide prevention chamber 402b'. A reducing gas delivery system 408 is included in processing system 400b'. Substrate oxide prevention chamber 402b' is closed using entry door 402a1' (which closes opening 402a1a'). A substrate transfer system (which may be part of a material handling system including support structure 102) is used to transfer substrate 104 through opening 402a1a' to substrate oxide prevention chamber 402b'. Substrate oxide prevention chamber 402b' includes an inert environment 406 (e.g., through a nitrogen supply, not shown for simplicity). A material handling system (e.g., including support structure 102) is used to move substrate 104 within substrate oxide prevention chamber 402b' to a bonding location 402c. While at bonding location 402c, a reducing gas 130 is provided by reducing gas delivery system 408.

FIG. 1D also illustrates bond head assembly 106, including heater 108, and bonding tool 110. FIG. 1D also illustrates main exhaust 404' which pulls exhaust gases (e.g., gases such as reducing gas vapors) from the processing area 400b' (sometimes referred to as the main machine compartment) or the inner environment chamber 420 through piping 404a' and 404b'. A manifold 214 is provided for receiving and distributing fluids (e.g., gases, vapors, etc.) as desired in the given application. Details of an exemplary bond head assembly 106, and an exemplary manifold 214, are described below in connection with FIGS. 11A-11D.

In connection with a bonding operation, semiconductor element 112 (which is carried by bond head assembly 106 into tunnel 402' through opening 402e') is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Manifold 214 provides a reducing gas 130 (e.g., where the reducing gas is a saturated vapor gas) in the area of semiconductor element 112 and substrate 104 in connection with a bonding operation. After reducing gas 130 is distributed in the area of semiconductor element 112 and substrate 104, reducing gas 130 contacts surfaces of each of electrically conductive structures of semiconductor element 112 and substrate 104.

Figure 2A:
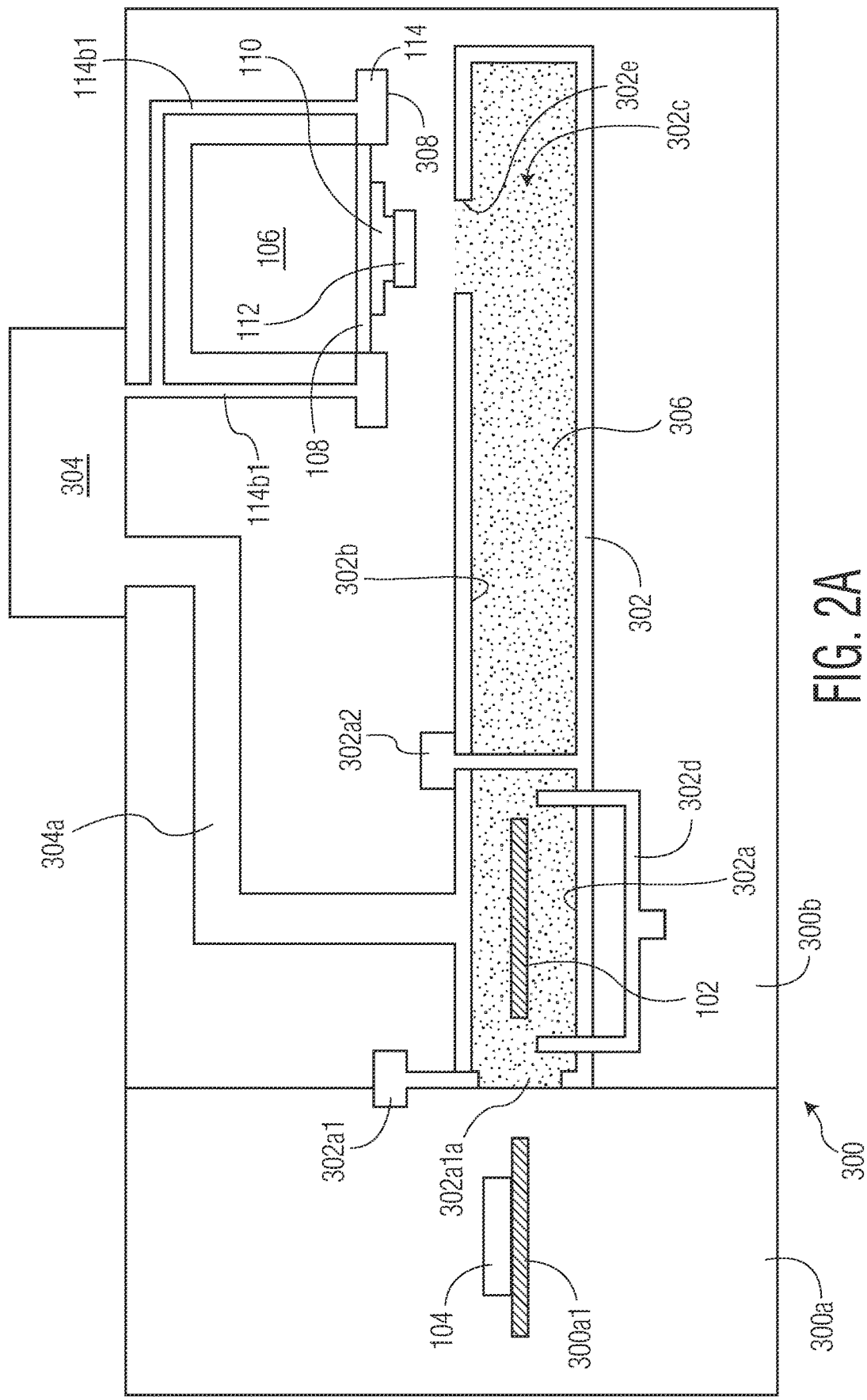
FIGS. 2A-2P are multiple series of block diagram illustrations of the bonding systems of FIGS. 1A-1D, illustrating various methods of bonding a semiconductor element to a substrate in accordance with various exemplary embodiments of the invention.
Figure 2B:
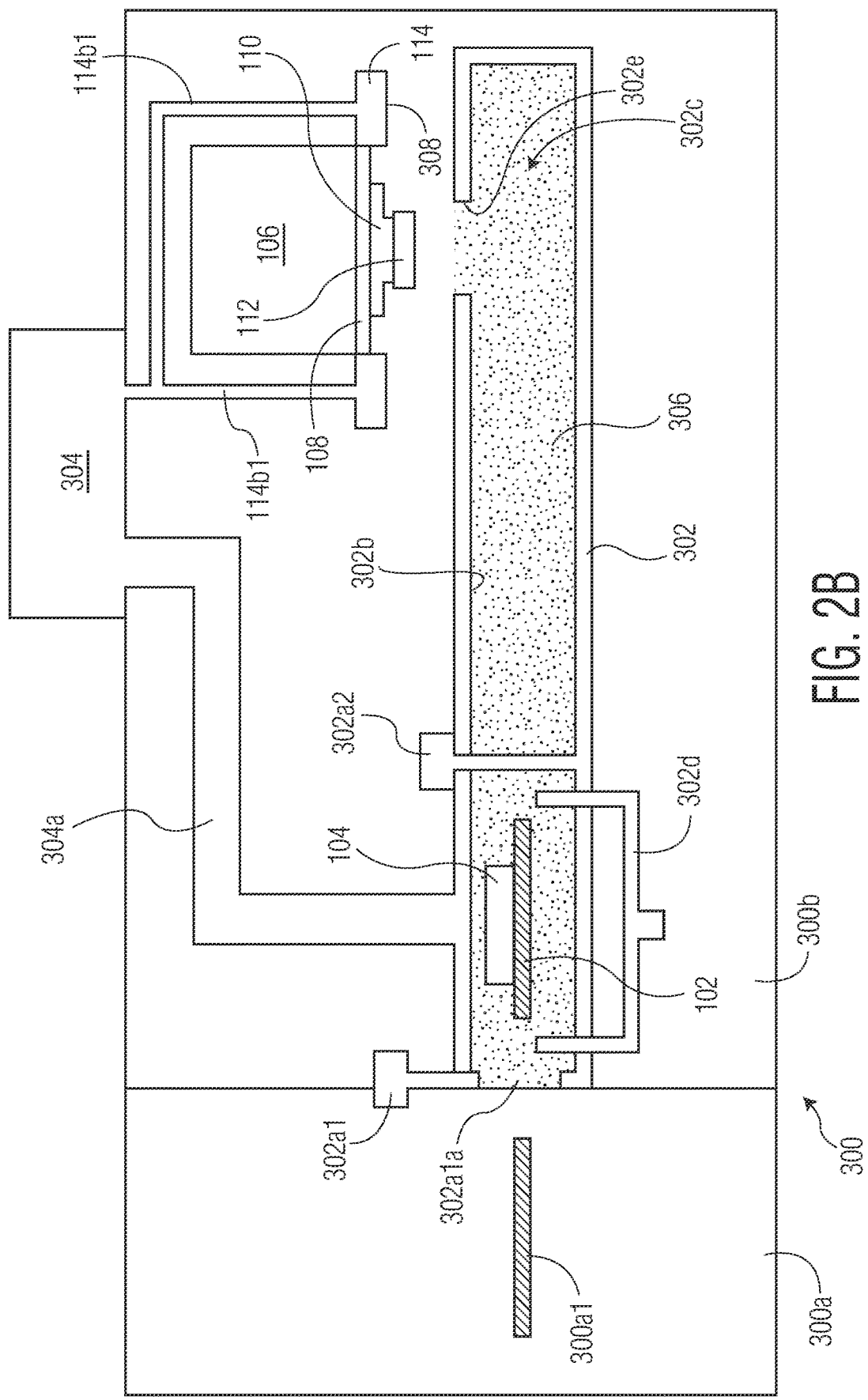
Figure 2C:
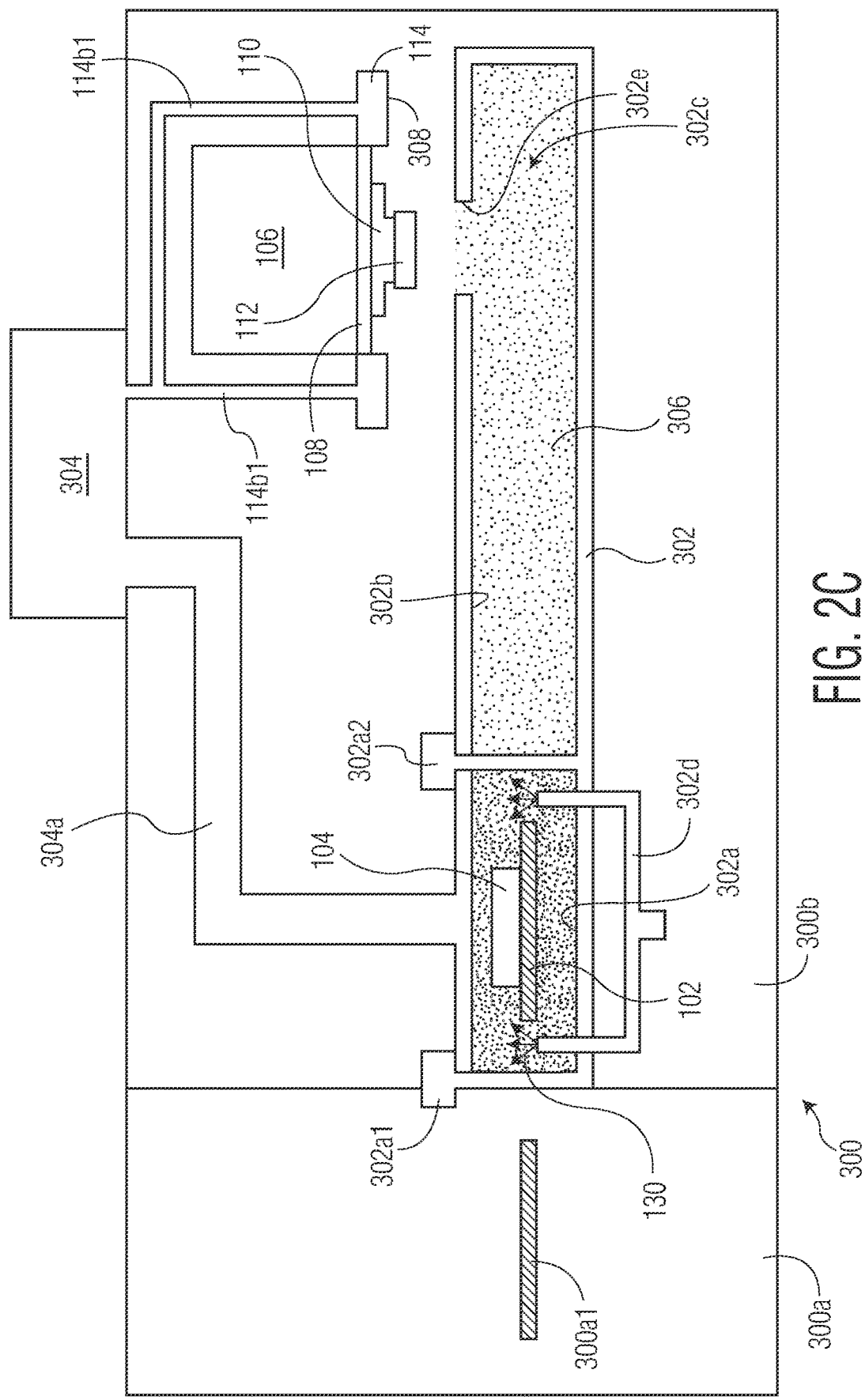
Figure 2D:
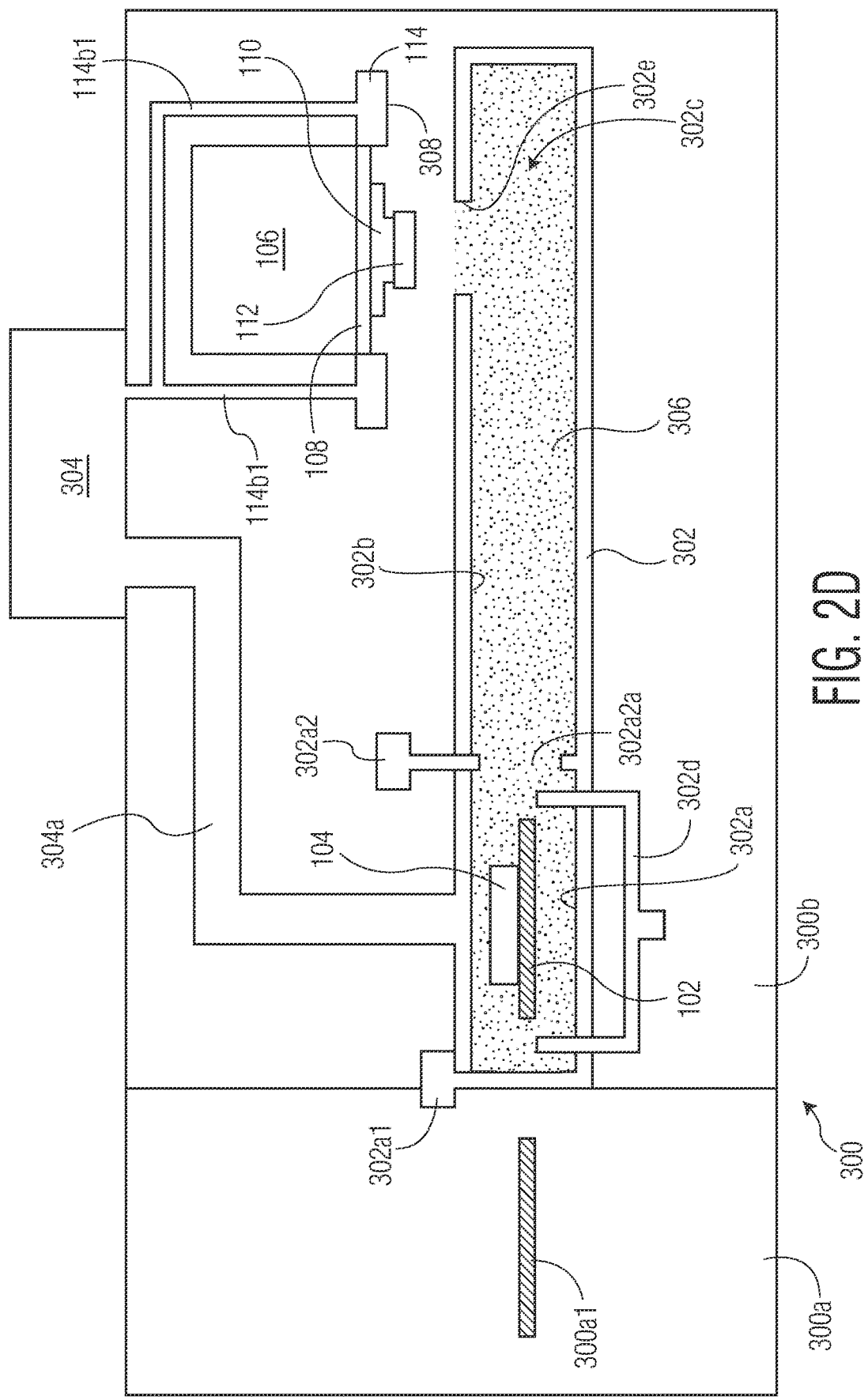
Figure 2E:
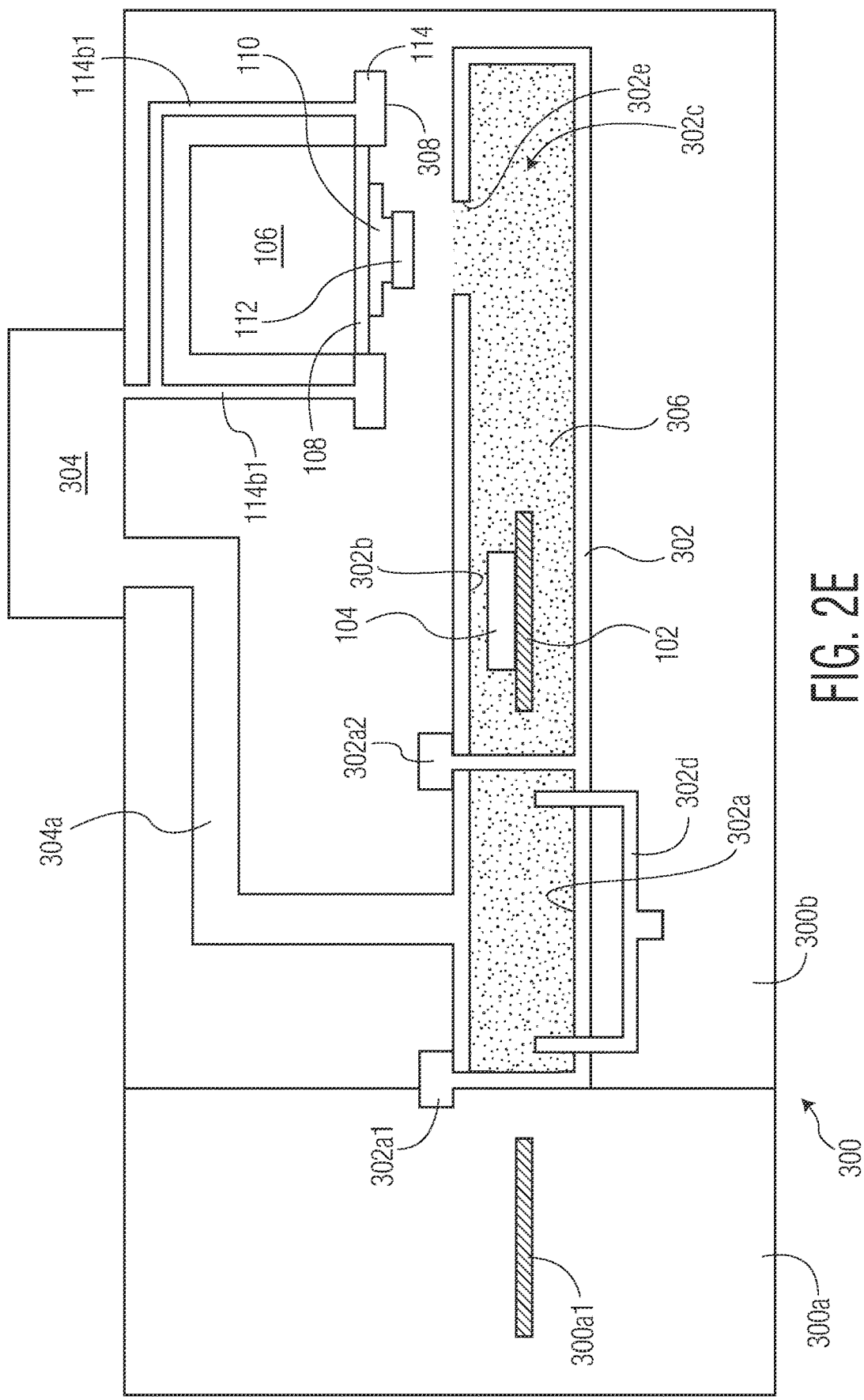
Figure 2F:
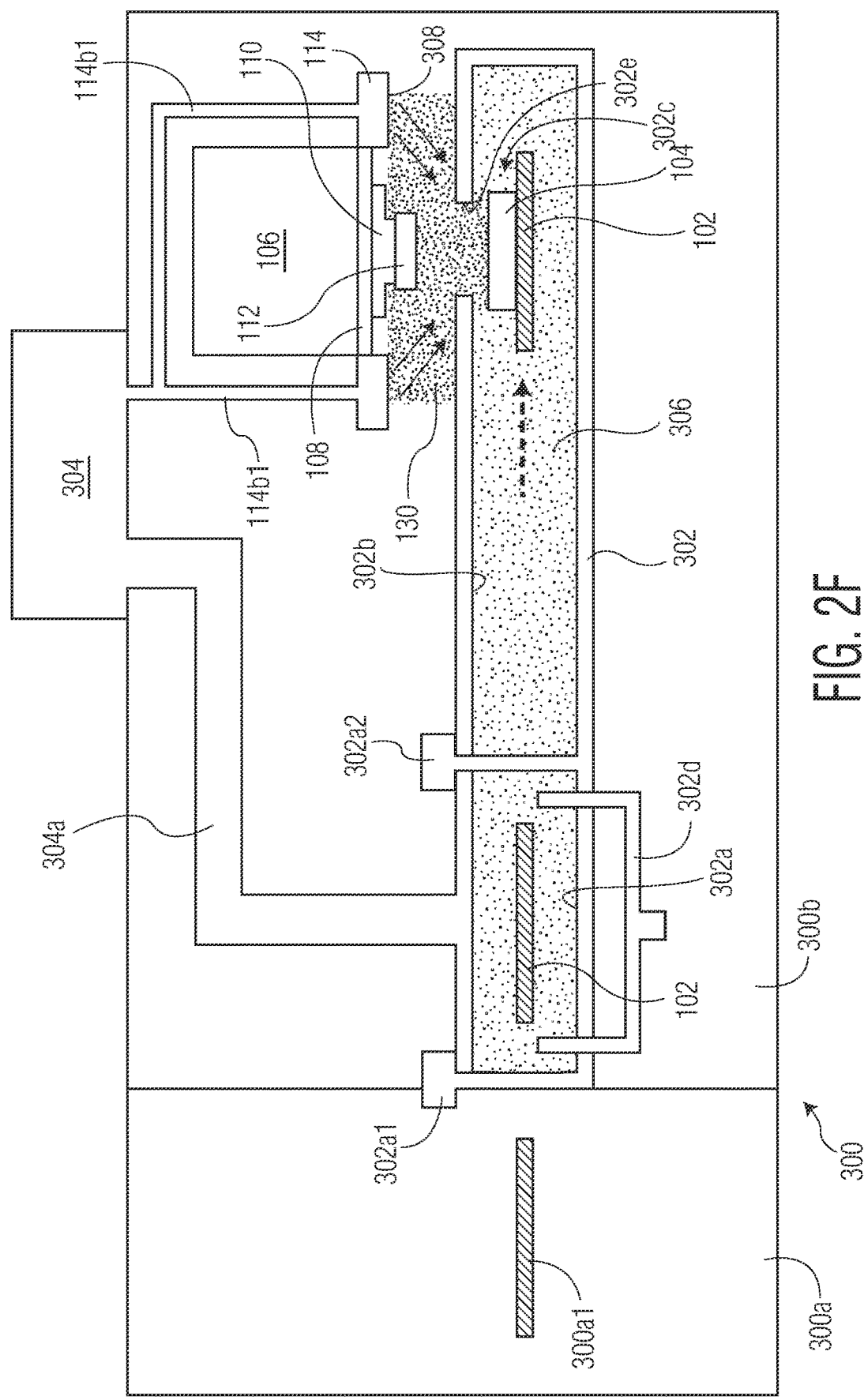
Figure 2G:
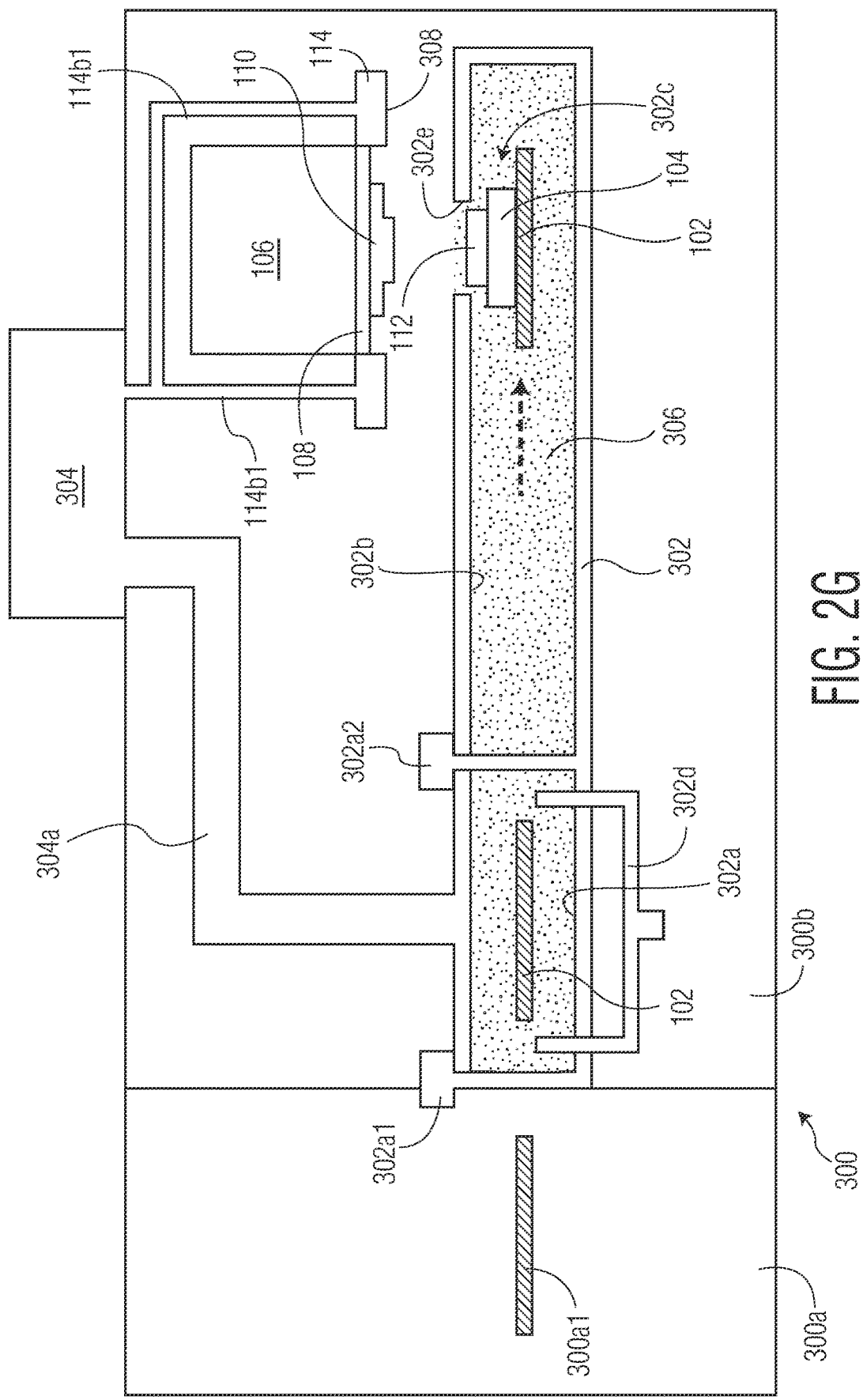

FIG. 2A-2G illustrate a method of bonding a semiconductor element 112 to a substrate 104 in connection with an exemplary embodiment of the invention, using bonding system 300 shown in FIG. 1A. FIG. 2A illustrates a substrate 104 in substrate source 300a, with entry door 302a1 in an open position. Substrate oxide reduction chamber 302a and substrate oxide prevention chamber 302b have an inert environment 306 (e.g., a nitrogen environment). At FIG. 2B, substrate 104 has been moved into substrate oxide reduction chamber 302a through opening 302a1a using a substrate handling system (e.g., a material handling system including support structure 102). At FIG. 2C, entry door 302a1 is closed, and a reducing gas 130 (e.g., formic acid vapor) is provided in substrate oxide reduction chamber 302a via reducing gas delivery system 302d. Reducing gas 130 removes residual oxide from the metal and solder pads (i.e., conductive structures) on substrate 104. At FIG. 2D, exit door 302a2 is opened, and substrate 104 is transferred from substrate oxide reduction chamber 302a to substrate oxide prevention chamber 302b as shown in FIG. 2E. Substrate oxide prevention chamber 302b includes an inert environment 306 (e.g., a nitrogen environment). In FIG. 2F, substrate 104 has been moved (e.g., using a material handling system including support structure 102) to bonding location 302c. At bonding location 302c, a reducing gas 130 is directed from bond head manifold 114 toward semiconductor element 112 and substrate 104. This reducing gas 130 is provided during bonding of semiconductor element 112 to substrate 104 to reduce/remove oxides on semiconductor element 112 as well as any remaining residual oxides on substrate 104. At FIG. 2G, semiconductor element 112 has been bonded to substrate 104 using bond head assembly 106.

Although FIGS. 2A-2G illustrate bonding system 300, it is contemplated that a substantially similar process could be applied to bonding system 400 shown in FIG. 1B, or other bonding systems within the scope of the invention.

Figure 2H:
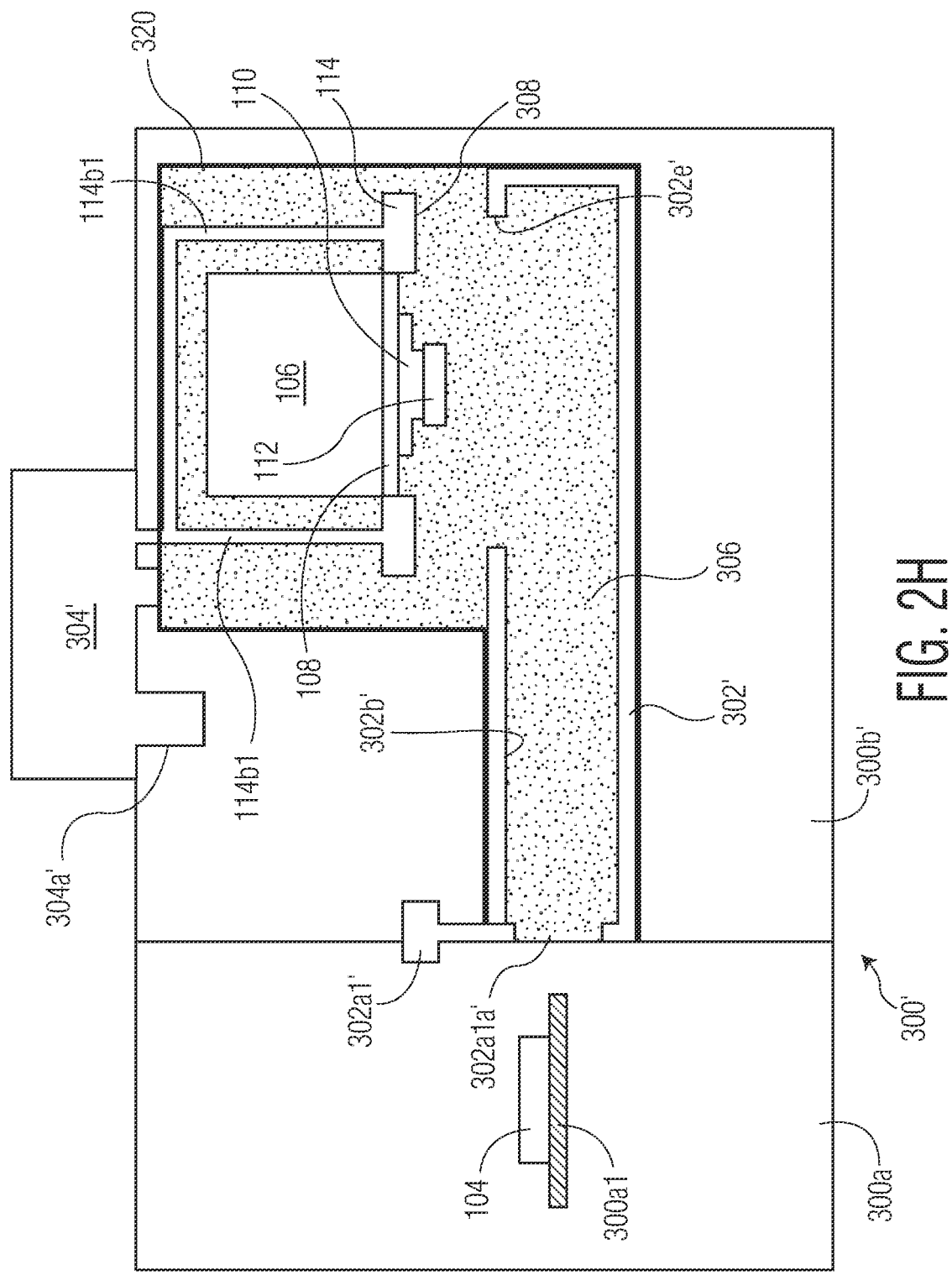
Figure 2J:
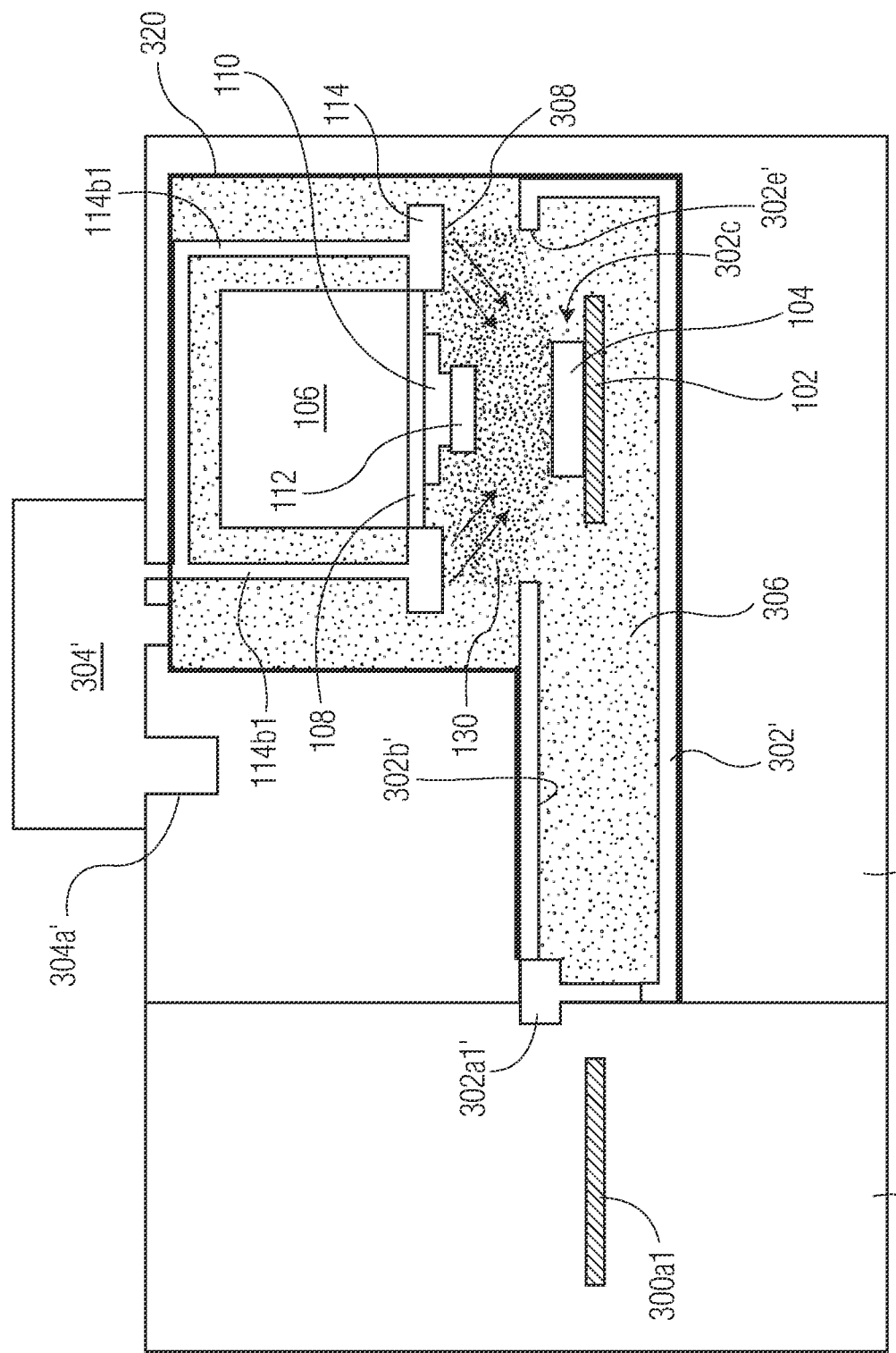
Figure 2K:
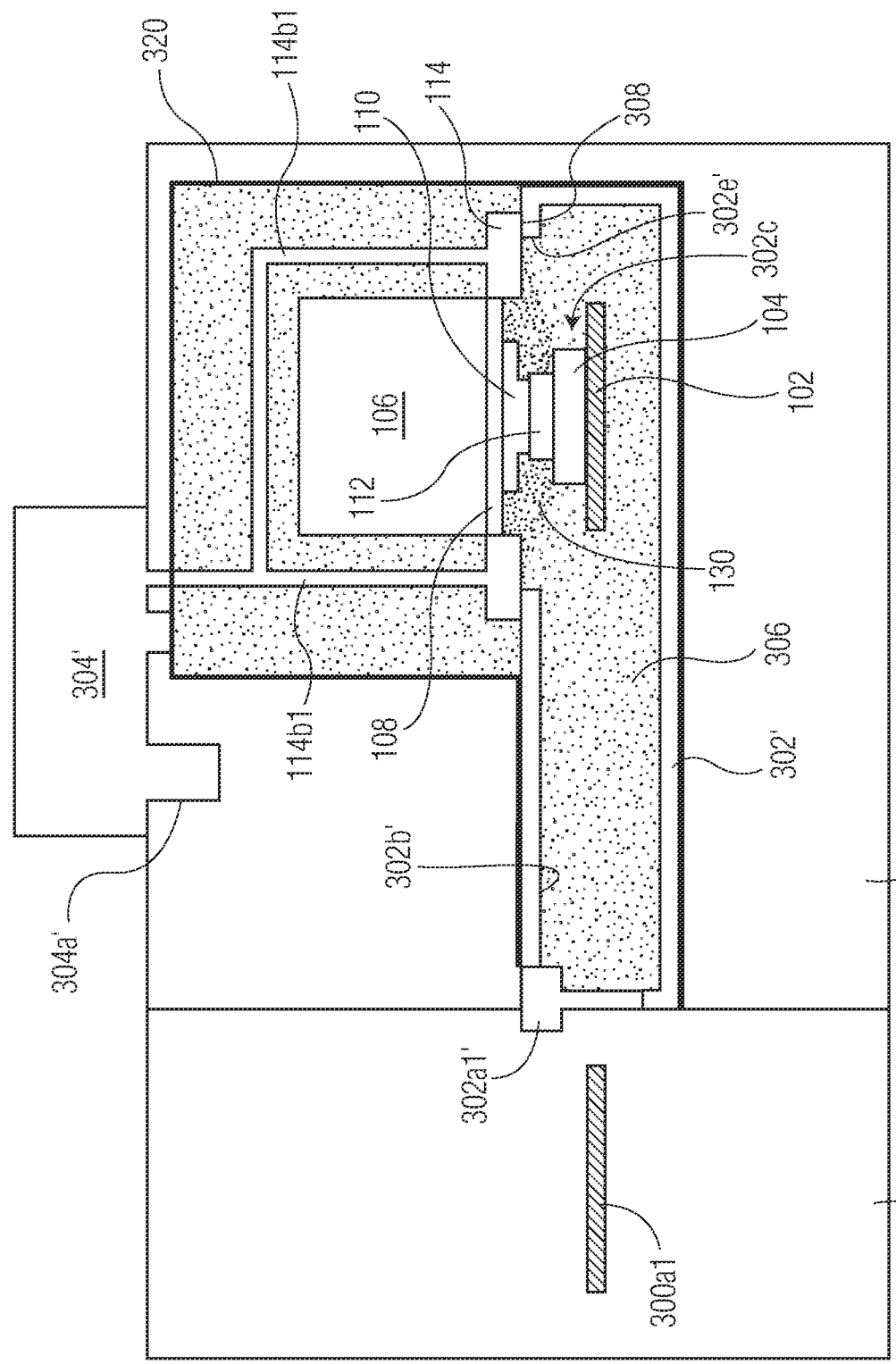
Figure 2L:
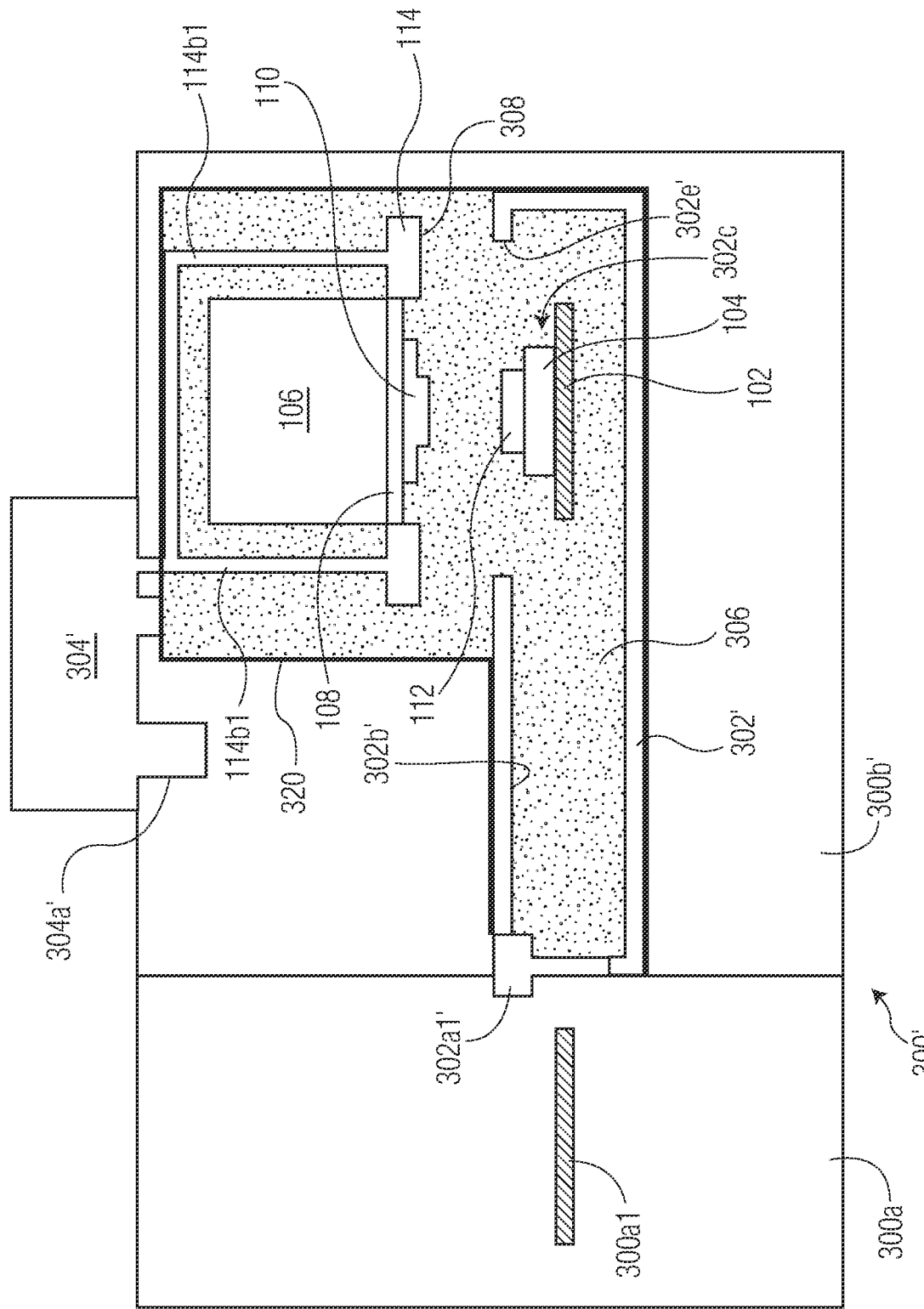

FIGS. 2H-2L illustrate a method of bonding a semiconductor element 112 to a substrate 104 in connection with an exemplary embodiment of the invention, using bonding system 300' shown in FIG. 1C. FIG. 2H illustrates a substrate 104 in substrate source 300a, with entry door 302a1' in an open position. Substrate oxide prevention chamber 302b' has an inert environment 306 (e.g., a nitrogen environment). At FIG. 2I, substrate 104 has been moved into substrate oxide prevention chamber 302b' through opening 302a1a' using a substrate handling system (e.g., a material handling system including support structure 102). Entry door 302a1' now closed. Substrate oxide prevention chamber 302b' includes an inert environment 306 (e.g., a nitrogen environment). In FIG. 2J, substrate 104 has been moved (e.g., using a material handling system including support structure 102) to bonding location 302c. At bonding location 302c, a reducing gas 130 is directed from bond head manifold 114 toward semiconductor element 112 and substrate 104. This reducing gas 130 is provided during bonding of semiconductor element 112 to substrate 104, for example, to reduce/remove oxides on semiconductor element 112 as well as any residual oxides on substrate 104. At FIG. 2K, bond head assembly 106 has been moved to bring semiconductor element 112 in contact with substrate 104. At FIG. 2L, semiconductor element 112 has been bonded to substrate 104 using bond head assembly 106.

Figure 2N:
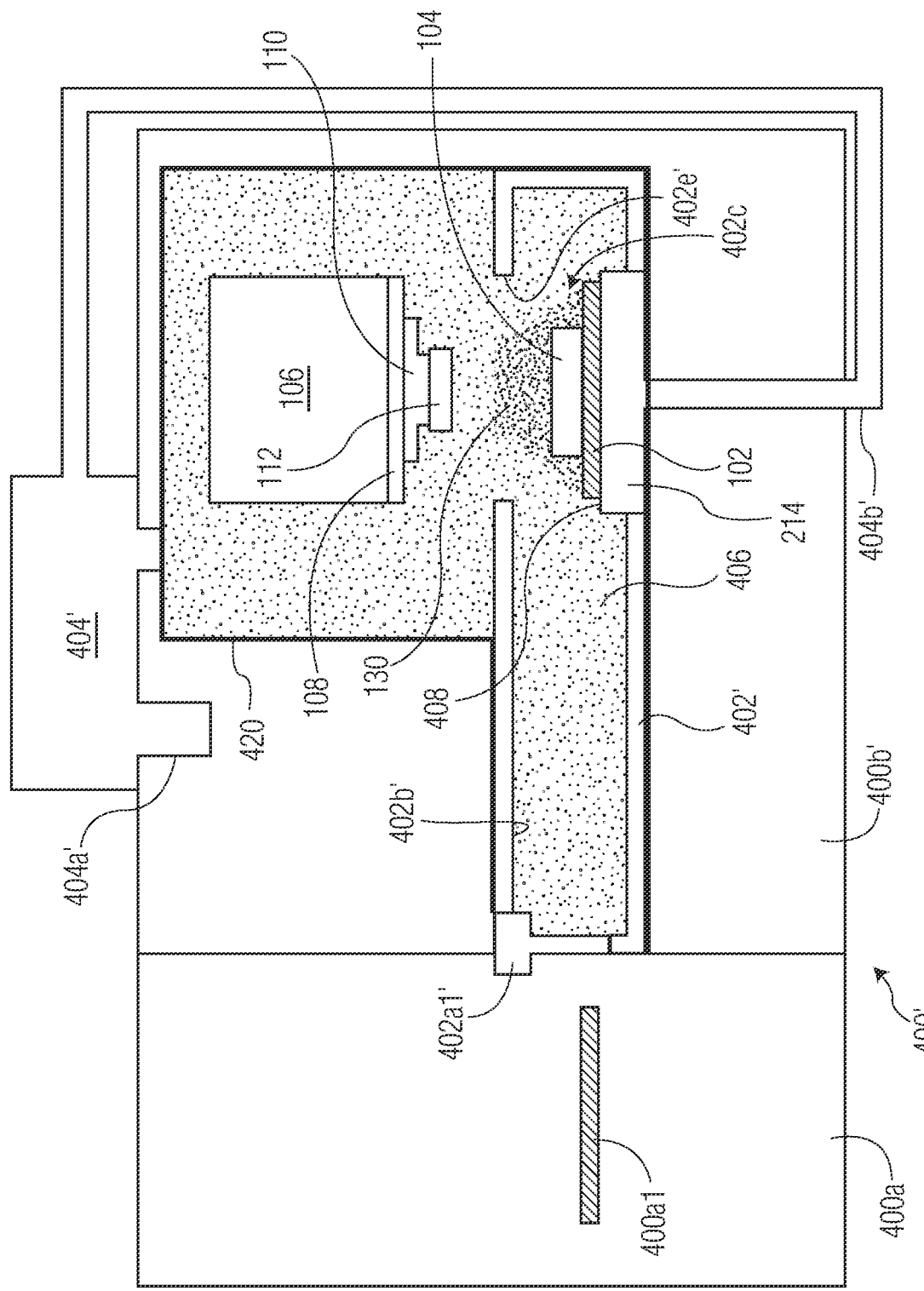
Figure 20:
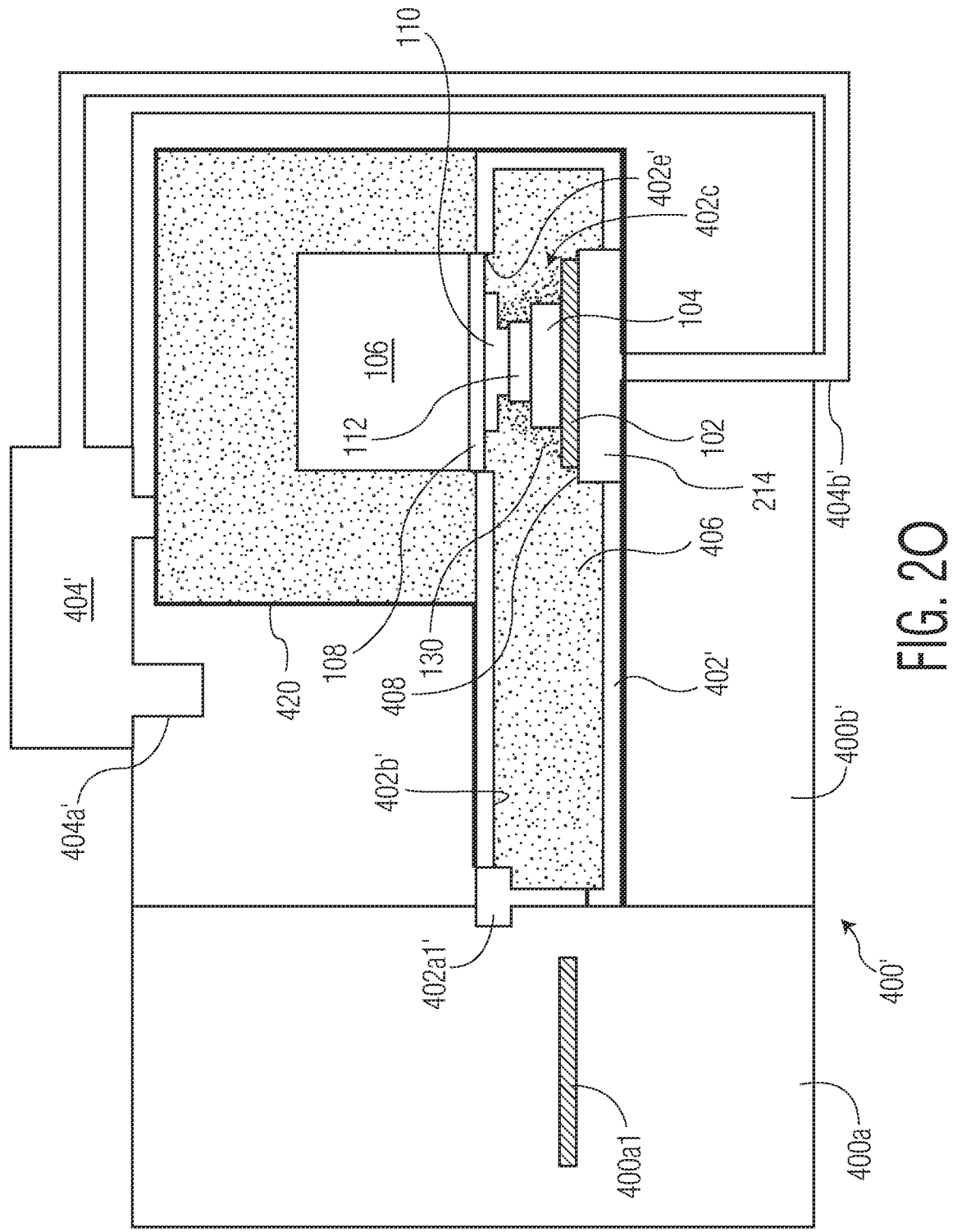

FIGS. 2M-2P illustrate a method of bonding a semiconductor element 112 to a substrate 104 in connection with an exemplary embodiment of the invention, using bonding system 400' shown in FIG. 1D. FIG. 2M illustrates a substrate 104 in substrate source 400a, with entry door 402a1' in an open position. Substrate oxide prevention chamber 402b' has an inert environment 406 (e.g., a nitrogen environment). At FIG. 2N, substrate 104 has been moved into substrate oxide prevention chamber 402b' through opening 402a1a' using a substrate handling system (e.g., a material handling system including support structure 102). Entry door 402a1' is now close. Substrate oxide prevention chamber 402b' includes an inert environment 406 (e.g., a nitrogen environment). In FIG. 2N, substrate 104 has been moved (e.g., using a material handling system including support structure 102) to bonding location 402c. At bonding location 402c, a reducing gas 130 is directed from manifold 214 toward semiconductor element 112 and substrate 104. This reducing gas 130 is provided during bonding of semiconductor element 112 to substrate 104, for example, to reduce/remove oxides on semiconductor element 112 as well as any residual oxides on substrate 104. At FIG. 2O, bond head assembly 106 has been moved to bring semiconductor element 112 in contact with substrate 104. At FIG. 2P, semiconductor element 112 has been bonded to substrate 104 using bond head assembly 106.

Figure 2P:
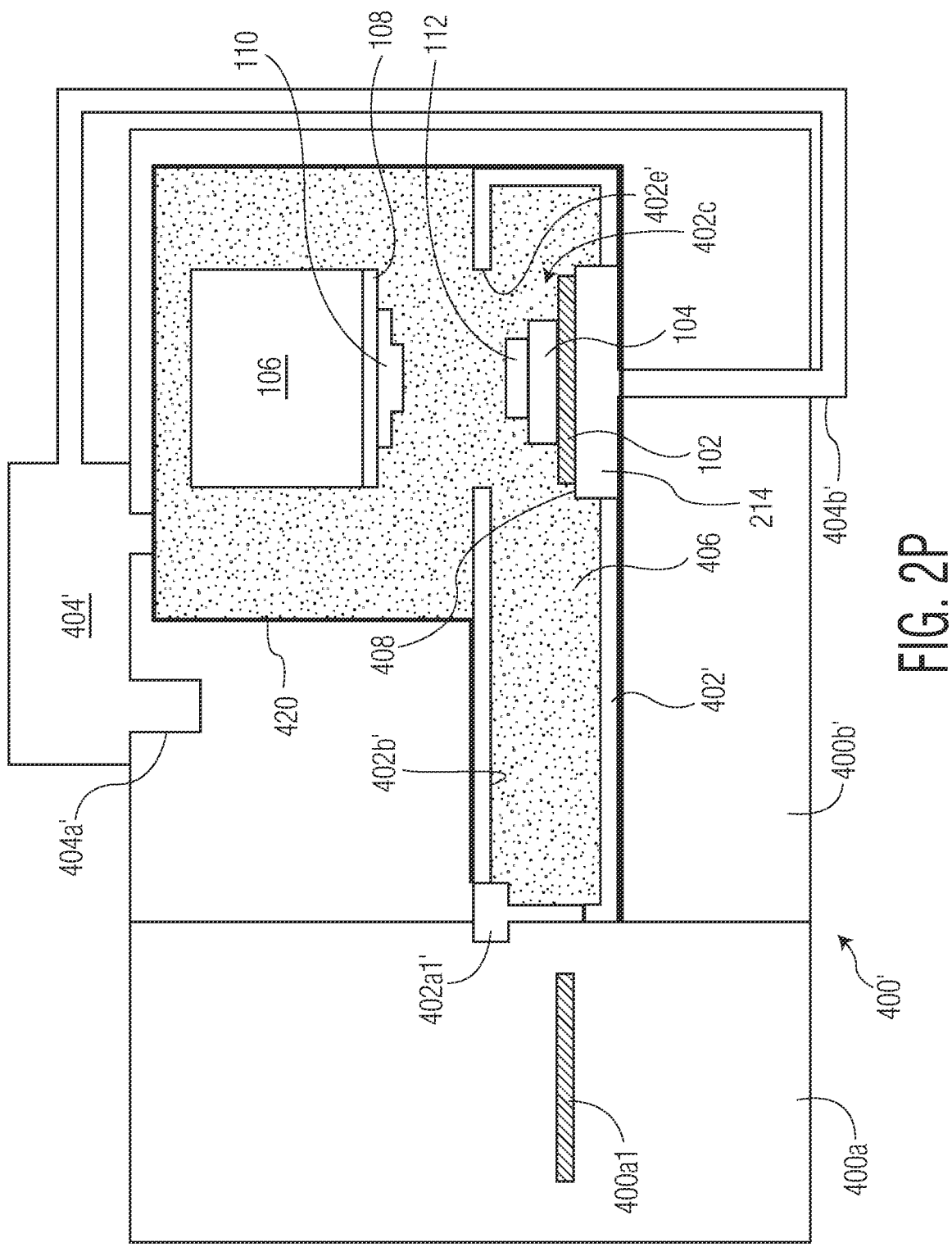
Figure 3A:
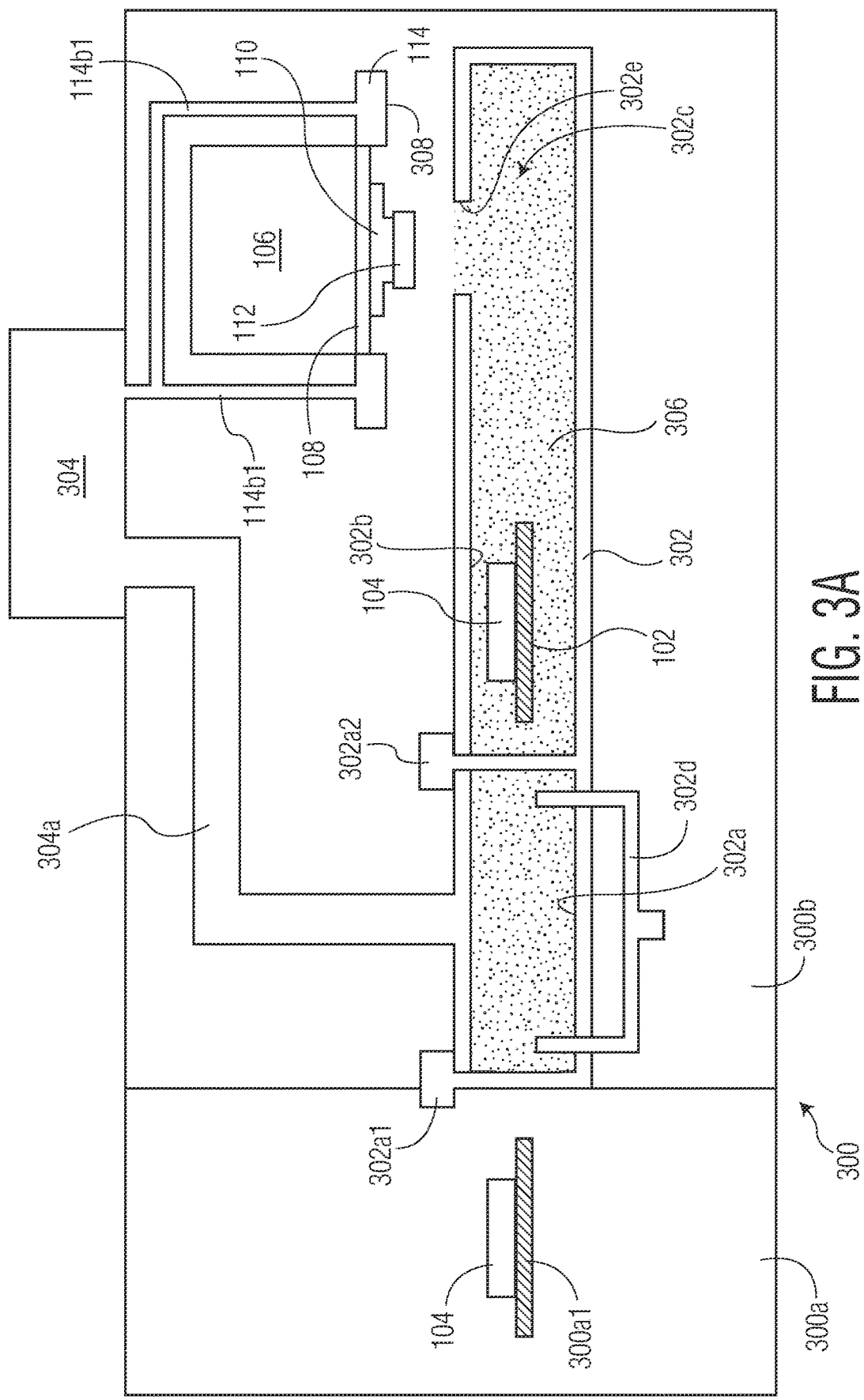
FIGS. 3A-3B are a series of block diagram illustrations of the bonding system of FIG. 1A, illustrating a method of bonding a semiconductor element to a substrate in accordance with an exemplary embodiment of the invention, while preparing another substrate for bonding.
Figure 3B:
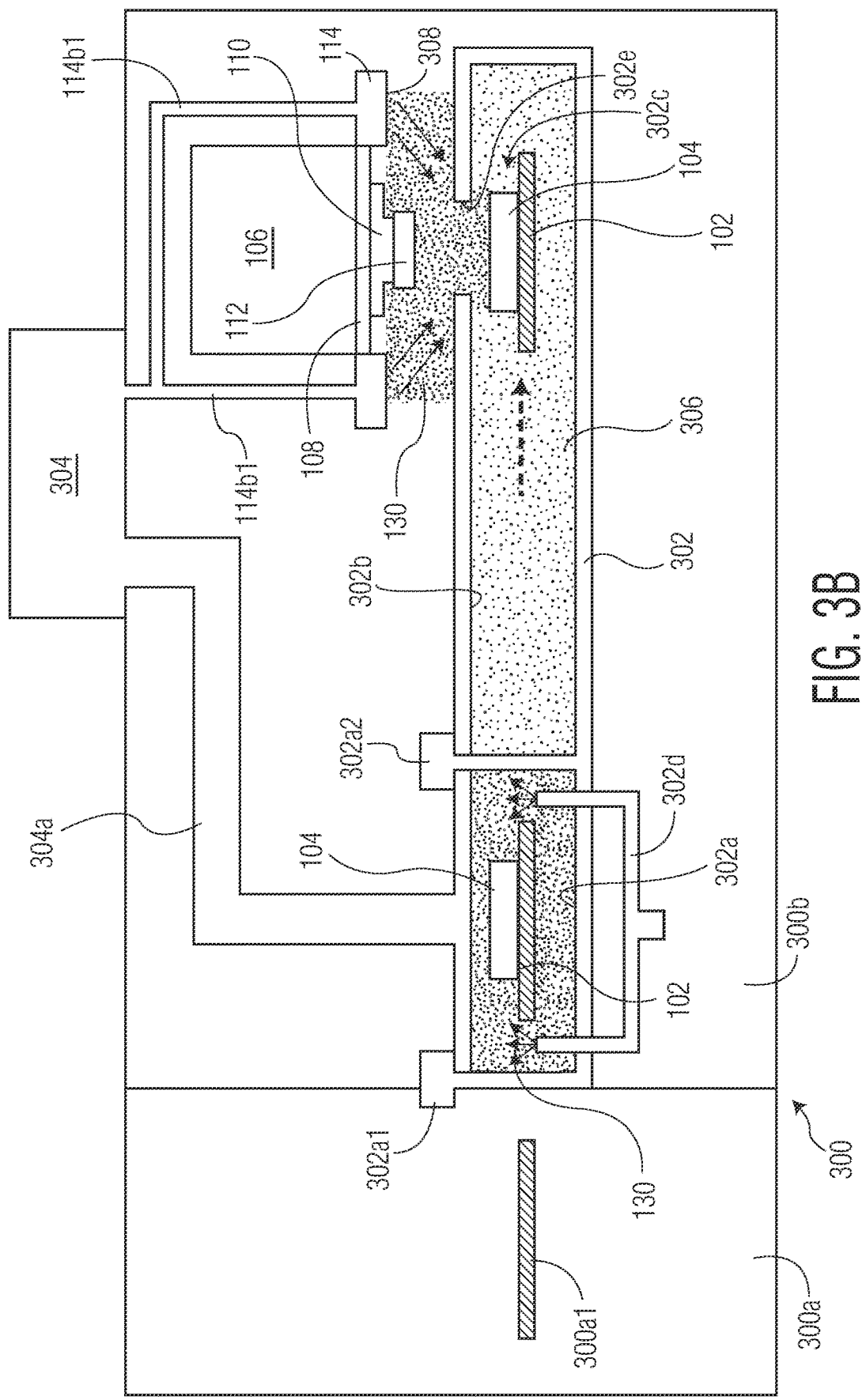

While the exemplary processes of FIGS. 2A-2P illustrate a single substrate 104, it is contemplated that a plurality of substrates 104 may be involved in bonding system 300 (or bonding system 400, 300', or 400' of FIGS. 1B, 1C, and, 1D respectively) (or another bonding system within the scope of the invention). Thus, FIGS. 3A-3B illustrate multiple substrates 104. In FIG. 3A, a first substrate 104 (already having been processed using substrate oxide reduction chamber 302a) is being moved to bonding location 302c of substrate oxide prevention chamber 302b. In FIG. 3B, while that substrate 104 is at bonding location 302c, another substrate 104 is in substrate oxide reduction chamber 302a (e.g., for cleaning of conductive structures on the another substrate 104).

Exemplary aspects of the invention provides an opportunity to rework a substrate 104 (e.g., to transfer the substrate back to substrate oxide reduction chamber 302a). For example, such an approach might be useful in situations where prolonged substrate exposures to heating is unavoidable, for example, bonding of small dies (e.g. 0.1-1 mm edge size) to a large area (e.g. 200-300 mm diameter substrate).

The invention may provide a number of benefits such as, for example: fluxless bonding (e.g., no fluxing of the semiconductor element or the substrate is required prior to or during bonding); reduction of oxides (e.g., metal oxides such as Cu and Sn oxides formed on pads/bumps) on both the semiconductor element and the substrate, as well as prevention of oxide formation during long heat exposures; a low consumption of nitrogen gas (or other gas providing the inert environment in the substrate oxide prevention chamber); and a pre-cleaning chamber, an inert gas chamber, and an in-situ oxide cleaning bond head are all provided in the same bonding system.

While it is not explicitly shown in FIG. 1A-1D, FIGS. 2A-2P, and FIGS. 3A-3B, it is understood that a bonding operation may include bonding a semiconductor element 112 (or a plurality of elements) to a portion of the bond sites (bonding areas) of substrate 104 in the tunnel (e.g., tunnel 302). For example, that portion of the bond sites of substrate 104 may be exposed by an opening in the tunnel 302, where the bonding tool may be lowered through opening 302e to complete the bonding operation. By only exposing a portion of substrate 104 at a time, the environment within tunnel 302 is better maintained.

In connection with bonding (e.g., thermocompression bonding) of a semiconductor element 112 (including electrically conductive structures) to a substrate 104 (including electrically conductive structures), heat may be provided through bonding tool 110 (e.g., from a heater of bond head assembly 106). A reducing gas may also be provided for cleaning oxides and/or other contaminants on the surface of the electrically conductive structures (of semiconductor element 112 and/or substrate 104).

In specific examples of such methods, a semiconductor element 112 (e.g., a semiconductor chip) is transferred from a source (e.g., a semiconductor wafer) to bonding tool 110 of a thermocompression bonding machine or a flip chip bonding machine. With semiconductor element 112 carried by bonding tool 110 (e.g., using vacuum), bond head assembly 106 (carrying bonding tool 110) is moved to a desired bonding position. The semiconductor element 112 is bonded to the bonding position of substrate 104 (e.g., while heating the semiconductor element 112 and/or the substrate 104) (e.g., where the bonding occurs in the presence of a reducing gas). The respective conductive structures of the semiconductor element 112, and/or the substrate 104 may include a solder material (e.g., the conductive structures may include a solder material at a contact surface, the conductive structures may be formed of a solder material, etc.), or the conductive structures may be formed of another conductive material (e.g., copper).

Throughout the various drawings (including FIGS. 4-9, FIGS. 10A-10D, and FIGS. 11A-11D), like reference numerals refer to the like elements, except where explained herein.

Figure 4:
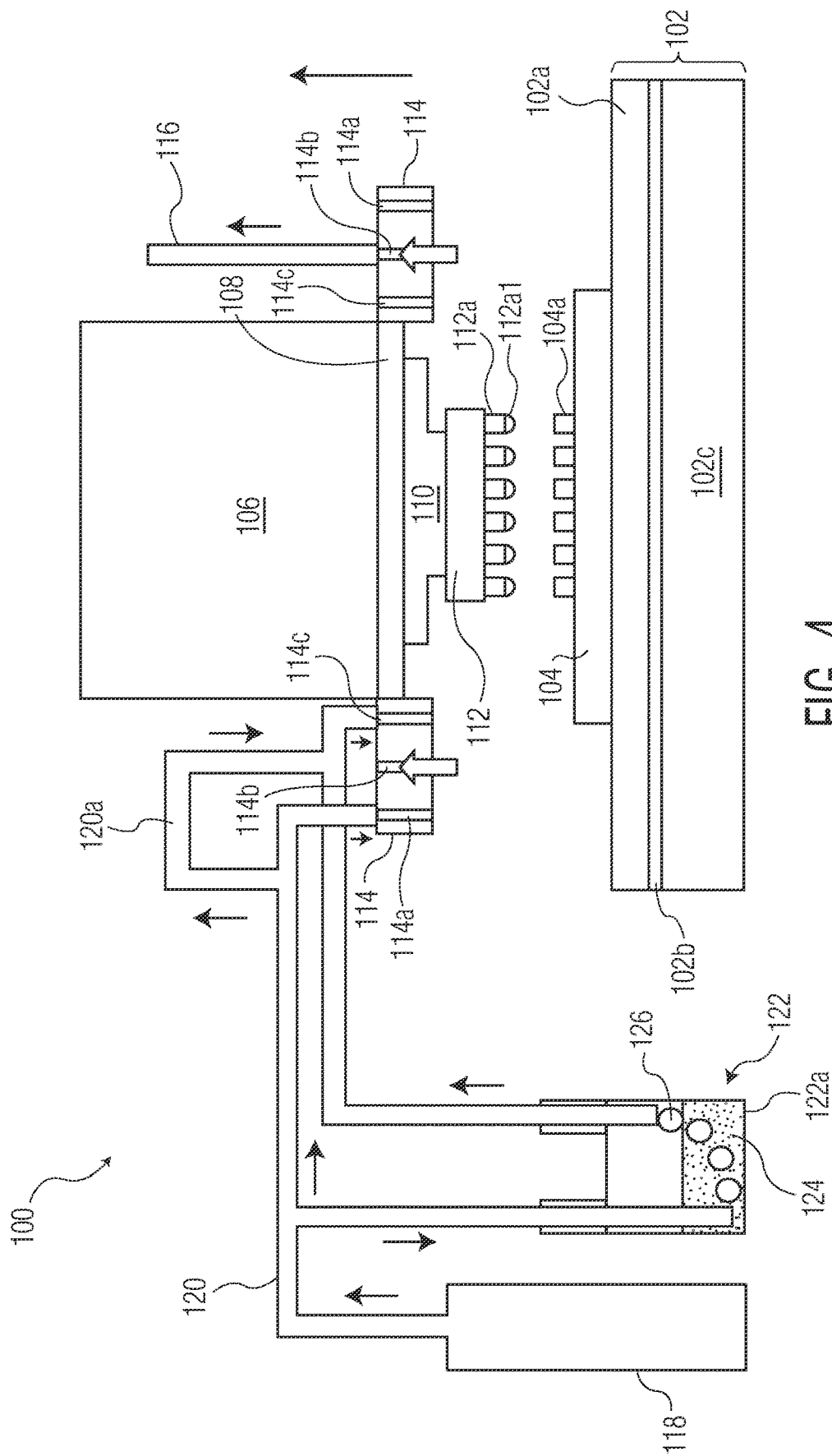
FIG. 4 is a block diagram illustration of a bonding system for bonding a semiconductor element, having conductive structures including a solder material, to a substrate in accordance with an exemplary embodiment of the invention.

Referring now to FIG. 4, a bonding machine 100 (e.g., a flip chip bonding machine, a thermocompression bonding machine, etc.) is provided. Bonding machine 100 includes a support structure 102 for supporting a substrate 104 during a bonding operation (where substrate 104 includes a plurality of electrically conductive structures 104a). Support structure 102 may include any appropriate structure for the specific application. In FIGS. 4-9 and FIGS. 10A-10D, support structure 102 includes top plate 102a (configured to directly support substrate 104), chuck 102c, and heater 102b disposed therebetween. In applications where heat for heating substrate 104 is desirable in connection with the bonding operation, a heater such as heater 102b may be utilized.

FIG. 4 also illustrates bond head assembly 106, which may be configured to move along (and about) a plurality of axes of bonding machine 100 such as, for example, the x-axis, y-axis, z-axis, theta (rotative) axis, etc. Bond head assembly 106 includes heater 108 and bonding tool 110. That is, in certain bonding machines (e.g., thermocompression bonding machines) it may be desirable to heat the bonding tool. Thus, while FIG. 4 illustrates a separate heater 108 for heating bonding tool 110 (for heating semiconductor element 112 including a plurality of electrically conductive structures 112a), it will be appreciated that heater 108 and bonding tool 110 may be integrated into a single element (e.g., a heated bonding tool).

In connection with a bonding operation, semiconductor element 112 is bonded to substrate 104 using bonding tool 110. During the bonding operation, corresponding ones of electrically conductive structures 112a are bonded (e.g., using heat, force, ultrasonic energy, etc.) to respective ones of electrically conductive structures 104a. In FIG. 4, electrically conductive structures 112a include a solder material 112a1 at a contact portion of each electrically conductive structure 112a (e.g., a portion configured to contact the electrically conductive structures 104a of substrate 104).

In certain bonding applications (e.g., flip chip and/or thermocompression bonding with copper conductive structures), it is desirable to provide an environment suitable for bonding. Conventionally, such an environment may be provided by using a reducing gas at the bonding area to reduce potential contamination of the electrically conductive structures of the semiconductor element or the substrate to which it will be bonded.

In FIG. 4, bond head assembly 106 carries a bond head manifold 114 for receiving and distributing fluids (e.g., gases, vapors, etc.) as desired in the given application. In FIG. 4, while bond head manifold 114 is illustrated in a cross sectional view, the actual bond head manifold 114 surrounds bonding tool 110 (e.g., bond head manifold 114 surrounds bonding tool 110 in a coaxial configuration). Of course, bond head manifold 114 may have different configurations from that shown in FIG. 4. Further, it is understood that certain details of bond head manifold 114 (e.g., interconnection with piping 120, structural details for distributing a reducing gas within bond head manifold 114, structural details for distributing a shielding gas within bond head manifold 114, structural details for drawing a vacuum through a center channel of bond head manifold 114, etc.) are omitted for simplicity.

Bond head manifold 114 includes three channels 114a, 114b, 114c having different functions. Outer channel 114a receives a shielding gas (e.g., nitrogen gas) from shielding gas supply 118. That is, a shielding gas is provided from shielding gas supply 118 (e.g., a nitrogen supply), through piping 120 (where piping 120 may include hard piping, flexible tubing, a combination of both, or any other structure adapted to carry the fluids described herein), to outer channel 114a of bond head manifold 114. From outer channel 114a of bond head manifold 114, the shielding gas 128 is provided as a shield from the outside environment (e.g., see FIGS. 10B-10C).

Inner channel 114c receives a reducing gas 130 (e.g., see FIGS. 10B-10C) (e.g., where the reducing gas is a saturated vapor gas) via piping 120, and provides reducing gas 130 in the area of semiconductor element 112 and substrate 104 in connection with a bonding operation. Reducing gas 130 is provided by a vapor generation system 122, but initiates as reducing gas 126. In the example shown in FIG. 4, vapor generation system 122 is a bubbler type system including an acid fluid 124 (e.g., formic acid, acetic acid, etc.) in vessel 122a of the bubbler type system. A carrier gas (e.g., nitrogen) is provided (via piping 120) into acid fluid 124 in vessel 122a, where the carrier gas acts as a carrier for the acid fluid 124. Collectively, the carrier gas (e.g., nitrogen) and acid fluid 124 are transported as reducing gas 126. Within piping 120, additional carrier gas (e.g., nitrogen) may be added to reducing gas 126 (e.g., to vary the concentration of the reducing gas, as desired) via piping section 120a, thereby providing reducing gas 130 in the area of semiconductor element 112 and substrate 104 in connection with the bonding operation. After reducing gas 130 is distributed in the area of semiconductor element 112 and substrate 104, reducing gas 130 contacts surfaces of each of electrically conductive structures 104a and electrically conductive structures 112a (e.g., see FIG. 10B). The surfaces of electrically conductive structures 104a/112a may then include a reaction product (e.g., where the reaction product is provided as a result of (i) a surface oxide on electrically conductive structures 104a/112a, and (ii) reducing gas from reducing gas 130 (and possibly heat provided by heater 108 and transferred to electrically conductive structures 104a via contact with electrically conductive structures 112a, if desired). This reaction product is desirably removed from the bonding area (i.e., the area where electrically conductive structures 112a of semiconductor element 112 are bonded to corresponding electrically conductive structures 104a of substrate 104) using vacuum provided through center channel 114b of bond head manifold 114 via exit piping 116.

Thus, FIG. 4 illustrates: (i) various elements of bonding machine 100; (ii) a path of carrier gas from carrier gas supply 118 to outer channel 114a of bond head manifold 114; (iii) a path of reducing gas 126 (which may receive additional carrier gas from piping 120) from vapor generation system 122 to inner channel 114c of bond head manifold 114, where it is released to the bonding area as reducing gas 130; and (iv) a path of gas (which may carry away a reaction product from surfaces of electrically conductive structures 104a/112a) drawn by vacuum through center channel 114b of bond head manifold 114. The aforementioned paths are illustrated in FIG. 4 through various arrows even though gas is not flowing in FIG. 4 (see FIGS. 10A-10D for an exemplary operation).

FIG. 5 again illustrates bonding machine 100 as shown in FIG. 4; however, in FIG. 5 electrically conductive structures 112a do not include a solder material 112a1 as shown in FIG. 4. Rather, in FIG. 5, electrically conductive structures 104a include a solder material 104a1 at a contact portion of each electrically conductive structure 104a (e.g., a portion configured to contact the electrically conductive structures 112a of semiconductor element 112).

Figure 5:
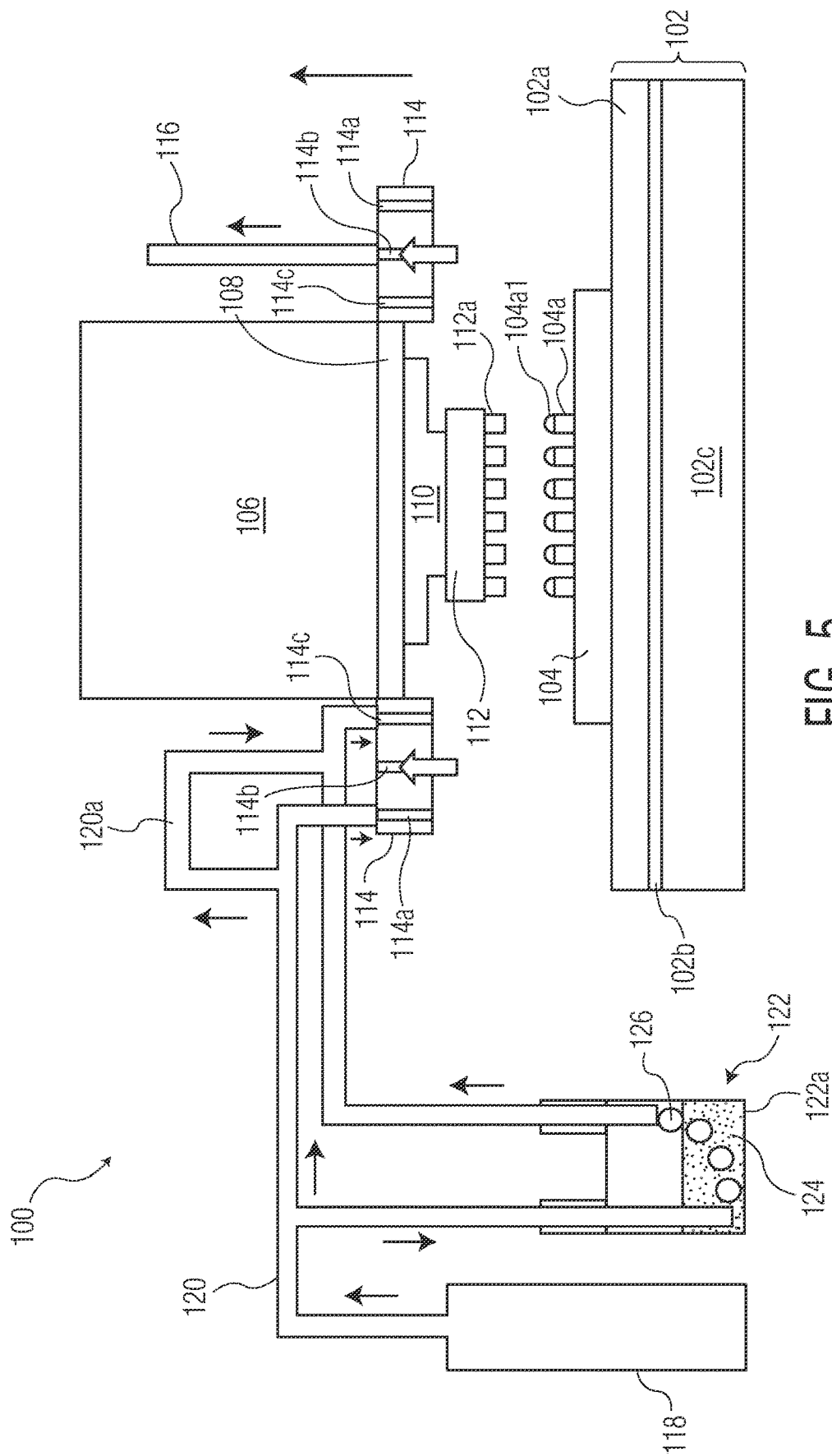
FIG. 5 is a block diagram illustration of a bonding system for bonding a semiconductor element to a substrate, having conductive structures including a solder material, in accordance with an exemplary embodiment of the invention.
Figure 6:
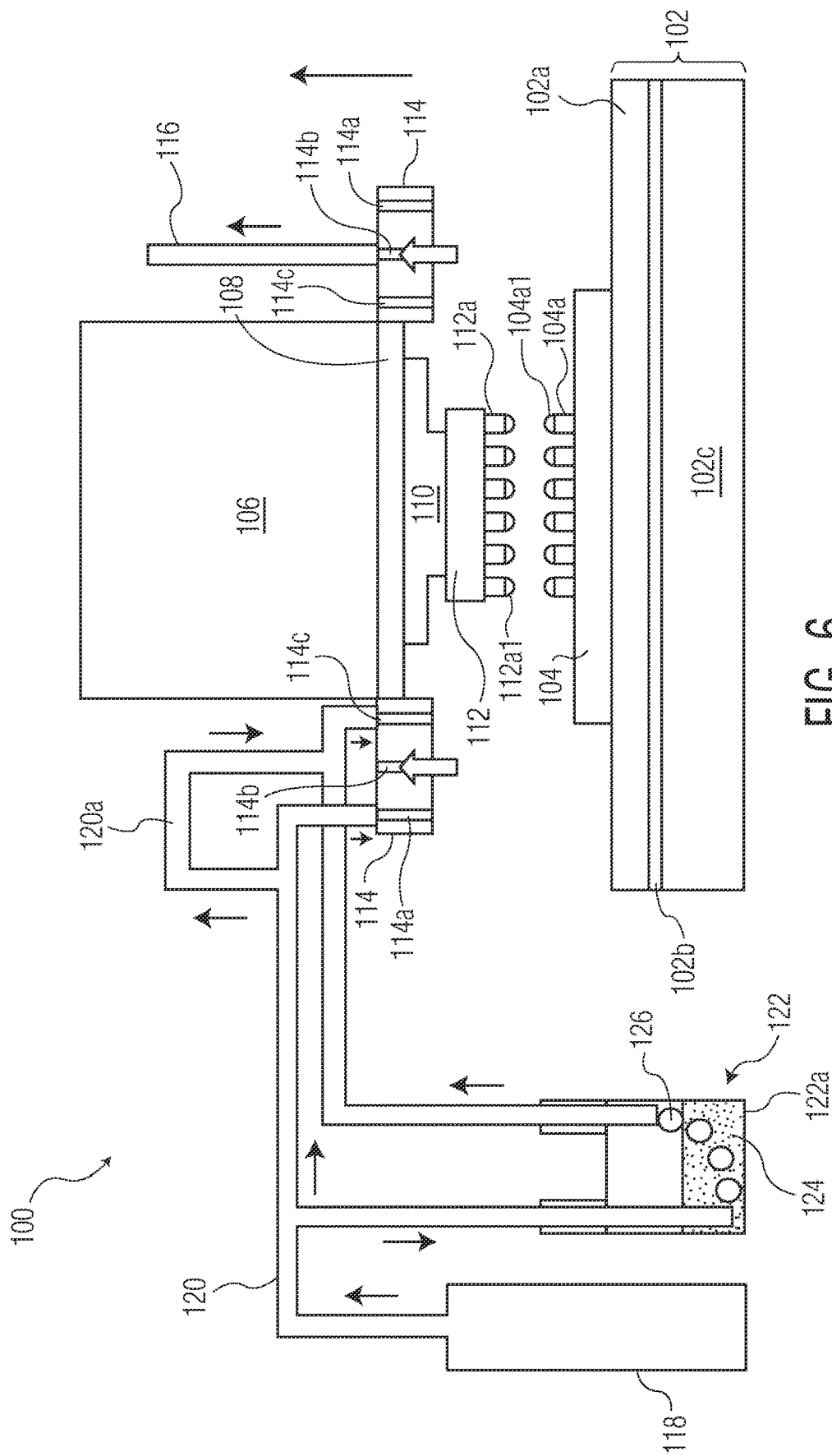
FIG. 6 is a block diagram illustration of a bonding system for bonding a semiconductor element, having conductive structures including a solder material, to a substrate, having conductive structures including a solder material, in accordance with an exemplary embodiment of the invention.

FIG. 6 again illustrates bonding machine 100 as shown in FIGS. 4-5; however, in FIG. 6 electrically conductive structures 112a include a solder material 112a1 as shown in FIG. 4, and electrically conductive structures 104a include a solder material 104a1 as shown in FIG. 5.

FIG. 7 again illustrates bonding machine 100 as shown in FIG. 4; however, in FIG. 7 electrically conductive structures 112a (shown in FIG. 4) are replaced by electrically conductive structures 112a2 which are formed of a solder material. That is, unlike FIG. 4, where electrically conductive structures 112a includes a solder material 112a1 at a contact portion, in FIG. 7, electrically conductive structures 112a2 are fully formed of a solder material.

FIG. 8 again illustrates bonding machine 100 as shown in FIG. 5; however, in FIG. 8 electrically conductive structures 104a (shown in FIG. 5) are replaced by electrically conductive structures 104a2 which are formed of a solder material. That is, unlike FIG. 5, where electrically conductive structures 104a includes a solder material 104a1 at a contact portion, in FIG. 8, electrically conductive structures 104a2 are fully formed of a solder material.

Figure 7:
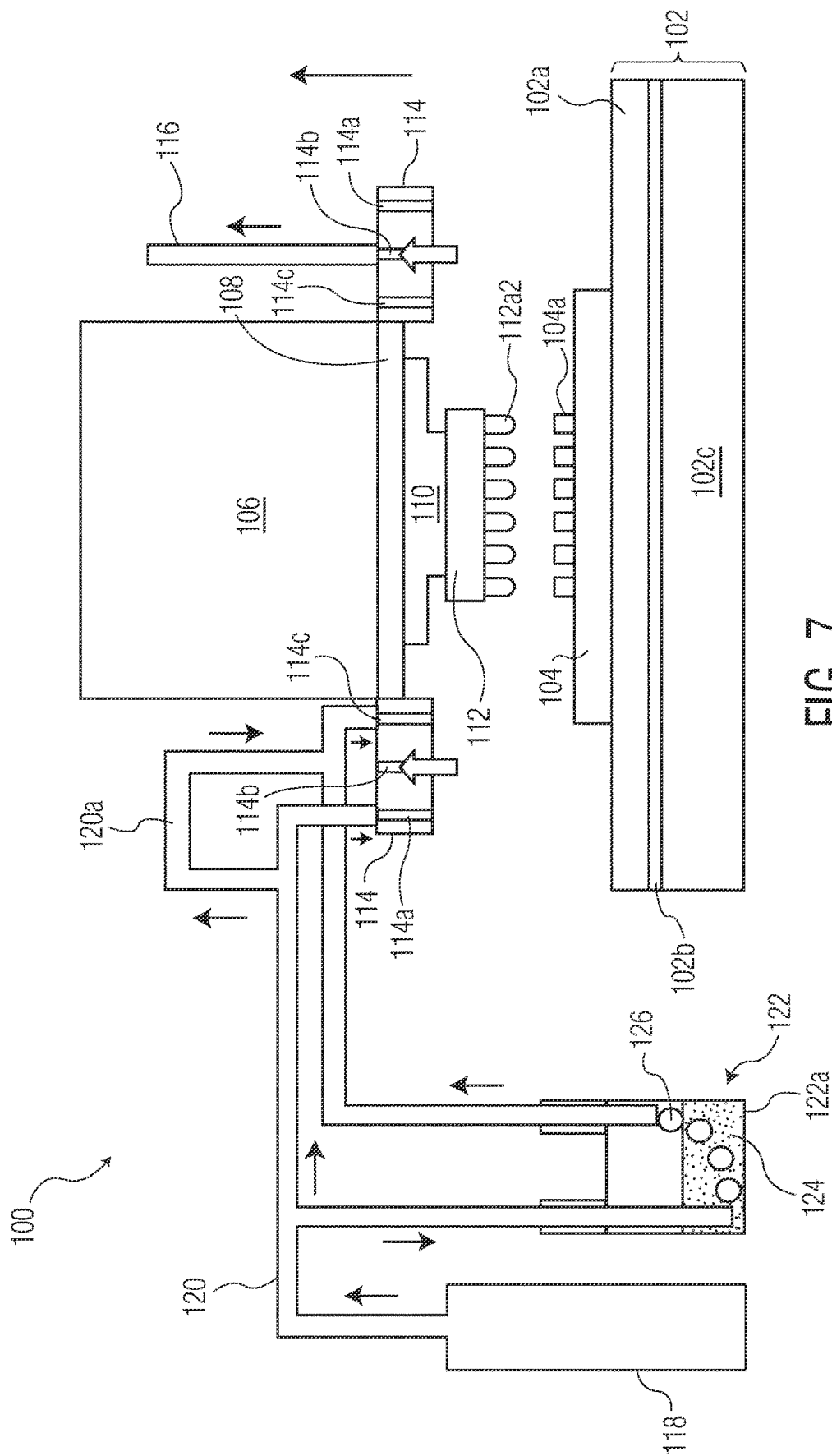
FIG. 7 is a block diagram illustration of a bonding system for bonding a semiconductor element, having conductive structures formed of a solder material, to a substrate in accordance with an exemplary embodiment of the invention.
Figure 8:
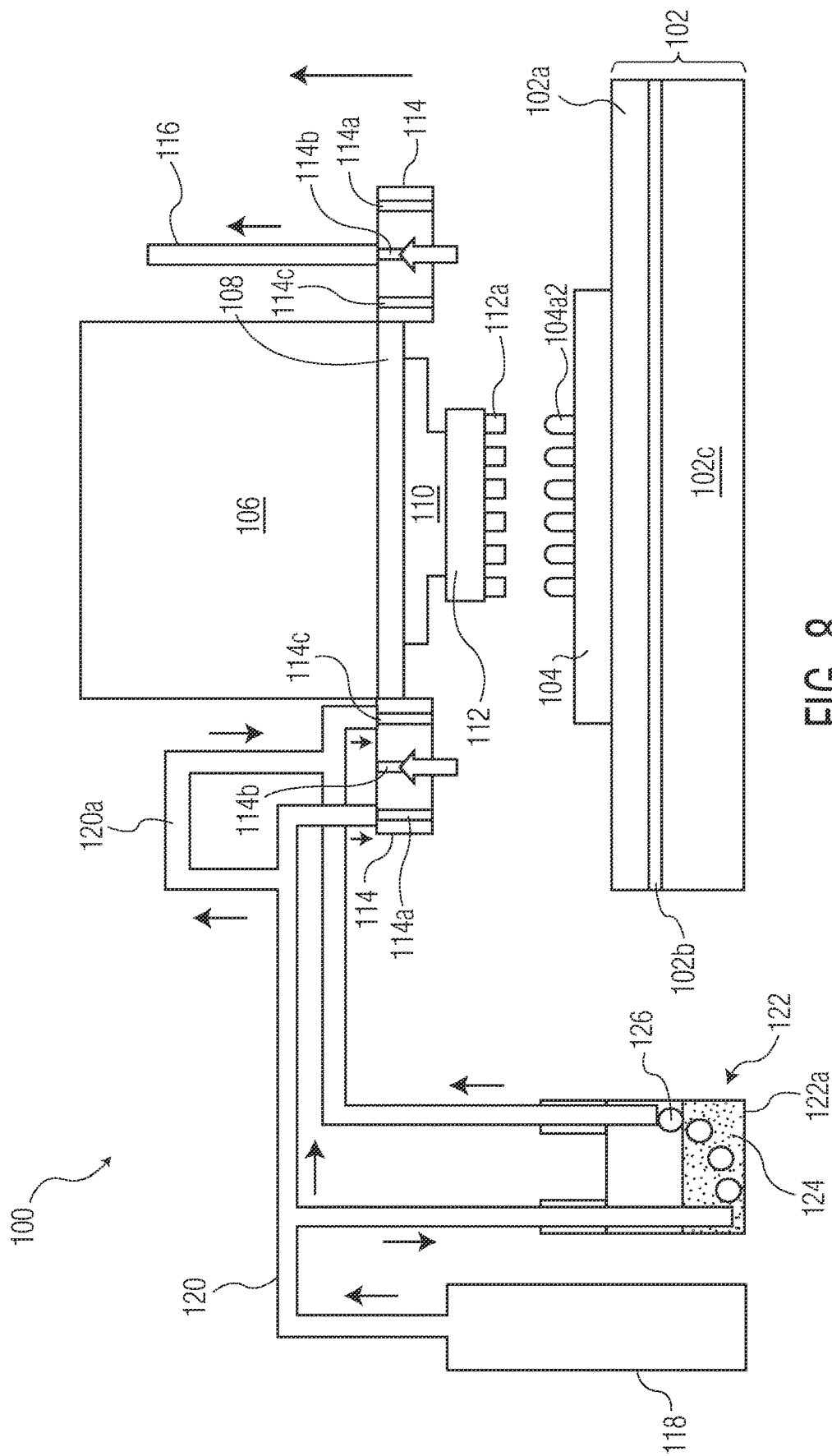
FIG. 8 is a block diagram illustration of a bonding system for bonding a semiconductor element to a substrate, having conductive structures formed of a solder material, in accordance with an exemplary embodiment of the invention.
Figure 9:
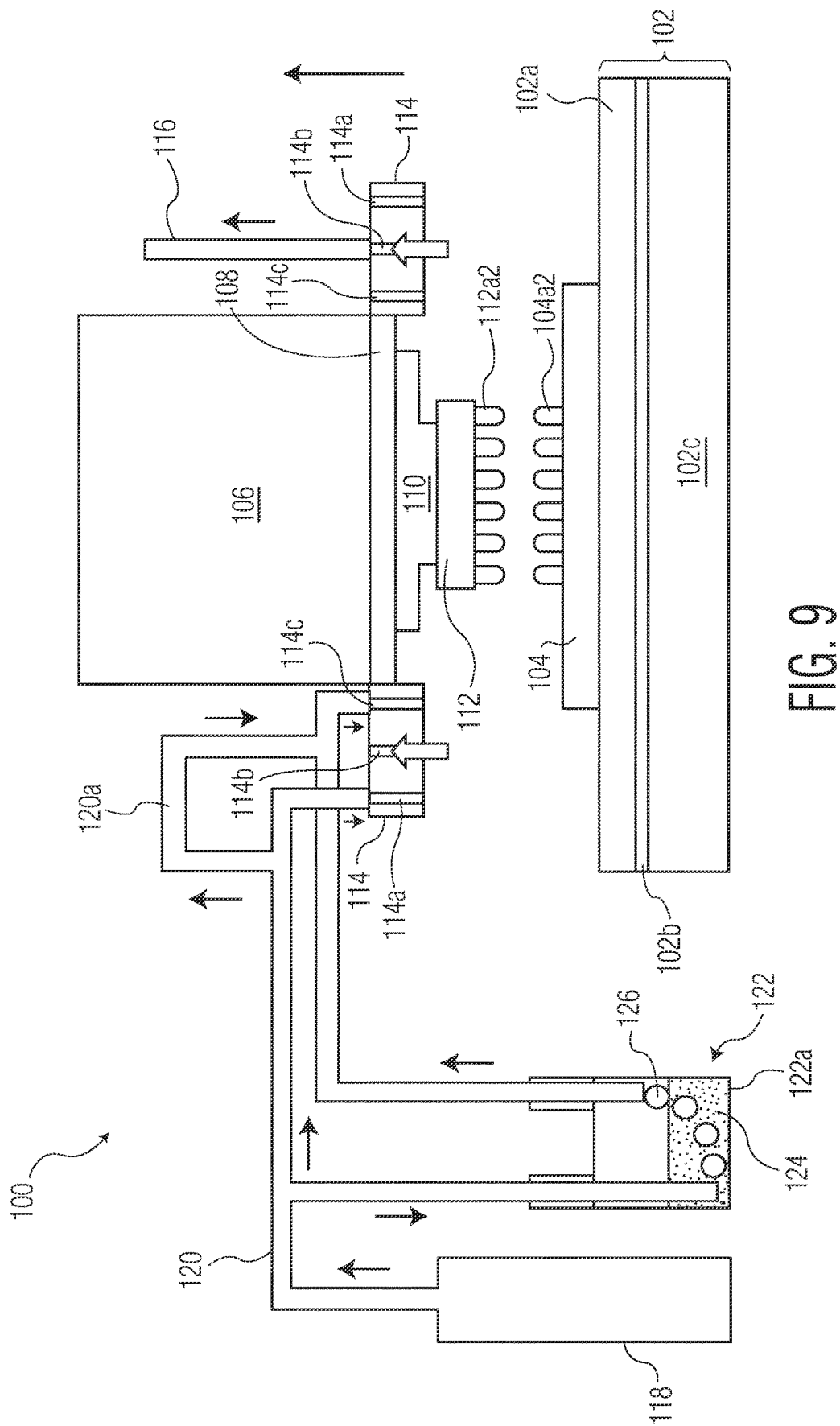
FIG. 9 is a block diagram illustration of a bonding system for bonding a semiconductor element, having conductive structures formed of a solder material, to a substrate, having conductive structures formed of a solder material, in accordance with an exemplary embodiment of the invention.

FIG. 9 again illustrates bonding machine 100 as shown in FIGS. 4-8; however, in FIG. 9 electrically conductive structures 112a (shown in FIGS. 4 and 6, including a solder material 112a1) are replaced by electrically conductive structures 112a2 (fully formed of a solder material) as shown in FIG. 7. Further, in FIG. 9, electrically conductive structures 104a (shown in FIG. 5, including a solder material 104a1) are replaced by electrically conductive structures 104a2 (fully formed of a solder material) as shown in FIG. 8.

Thus, according to certain aspects of the invention the electrically conductive structures of the semiconductor element being bonded, or the substrate configured to receive the semiconductor element during bonded, may include a solder material. The solder material may be included in a number of different configurations. For example, the solder material may be included at a contact portion of the electrically conductive structures (e.g., see FIGS. 4-6). In another non-limiting example, the entire electrically conductive structures may be formed of the solder material (e.g., see FIGS. 7-9).

FIGS. 10A-10D and FIGS. 11A-11D are block diagrams illustrating methods of bonding a semiconductor element to a substrate. In each of FIGS. 10A-10D and FIGS. 11A-11D: (i) the semiconductor element 112 (with electrically conductive structures 112a including solder material 112a1 at a contact portion) is shown as in FIG. 4; and (ii) the substrate 104 (with electrically conductive structures 104a not including a solder material) is shown as in FIG. 4. However, it is understood that the methods shown and described with respect to FIGS. 10A-10D and FIGS. 11A-11D are equally applicable to the semiconductor elements and substrates of each of FIGS. 4-9, and are applicable to the semiconductor elements and substrates of any other embodiment within the scope of the invention.

Prior to the processes shown and described in connection with FIGS. 10A-10D and FIGS. 11A-11D, semiconductor element 112 and/or substrate 104 may be "cleaned". For example, the electrically conductive structures 112a, 104a of one or both of semiconductor element 112 and substrate 104 may be cleaned using a solution such as hydrochloric acid or acetic acid. Such a cleaning step may be performed, for example, by dipping at least a portion of semiconductor element 112 and/or substrate 104 into such a solution.

Figure 10A:
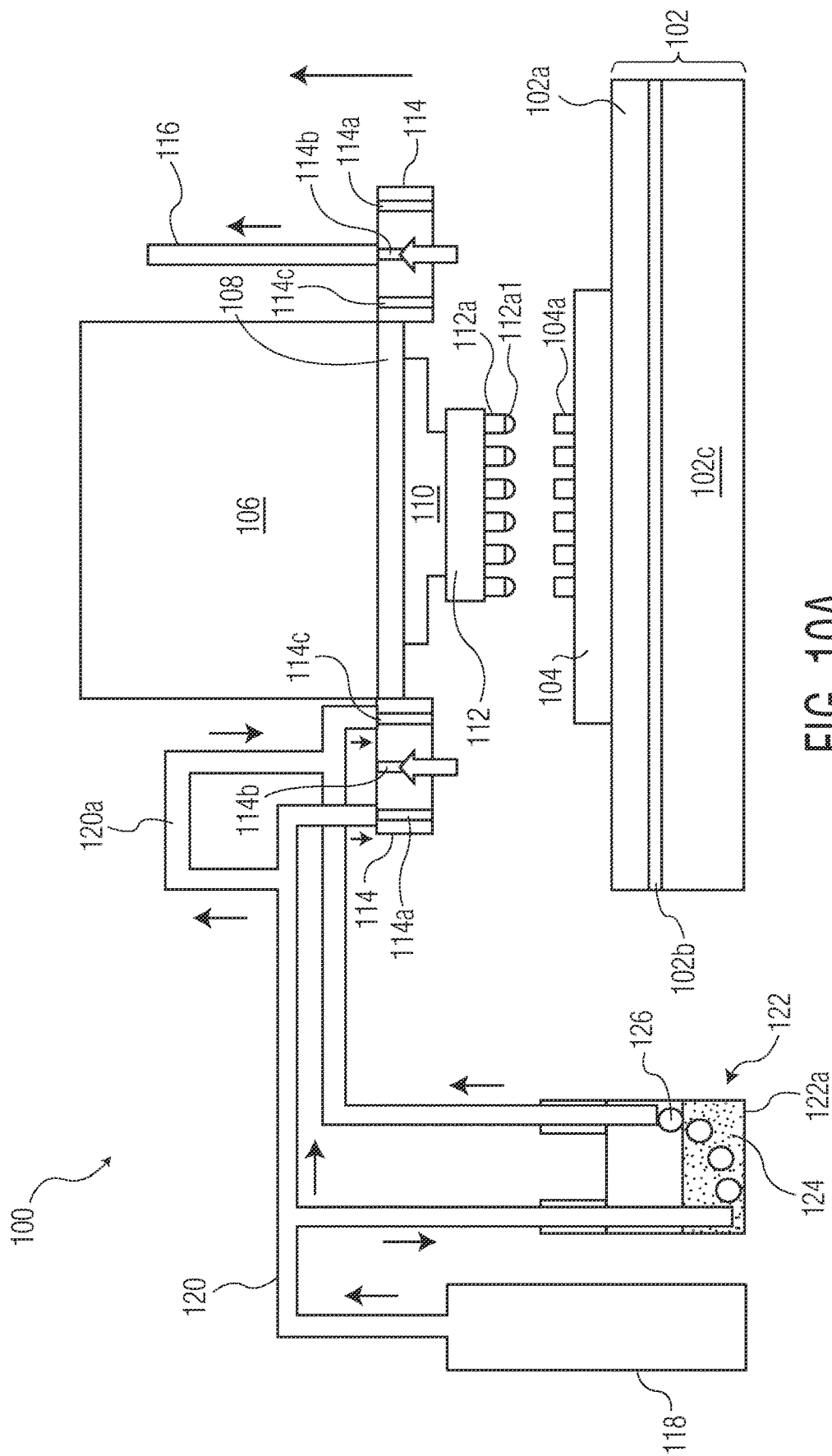
FIGS. 10A-10D are a series of block diagram illustrations of the bonding system of FIG. 4, illustrating a method of bonding a semiconductor element to a substrate in accordance with an exemplary embodiment of the invention.
Figure 10B:
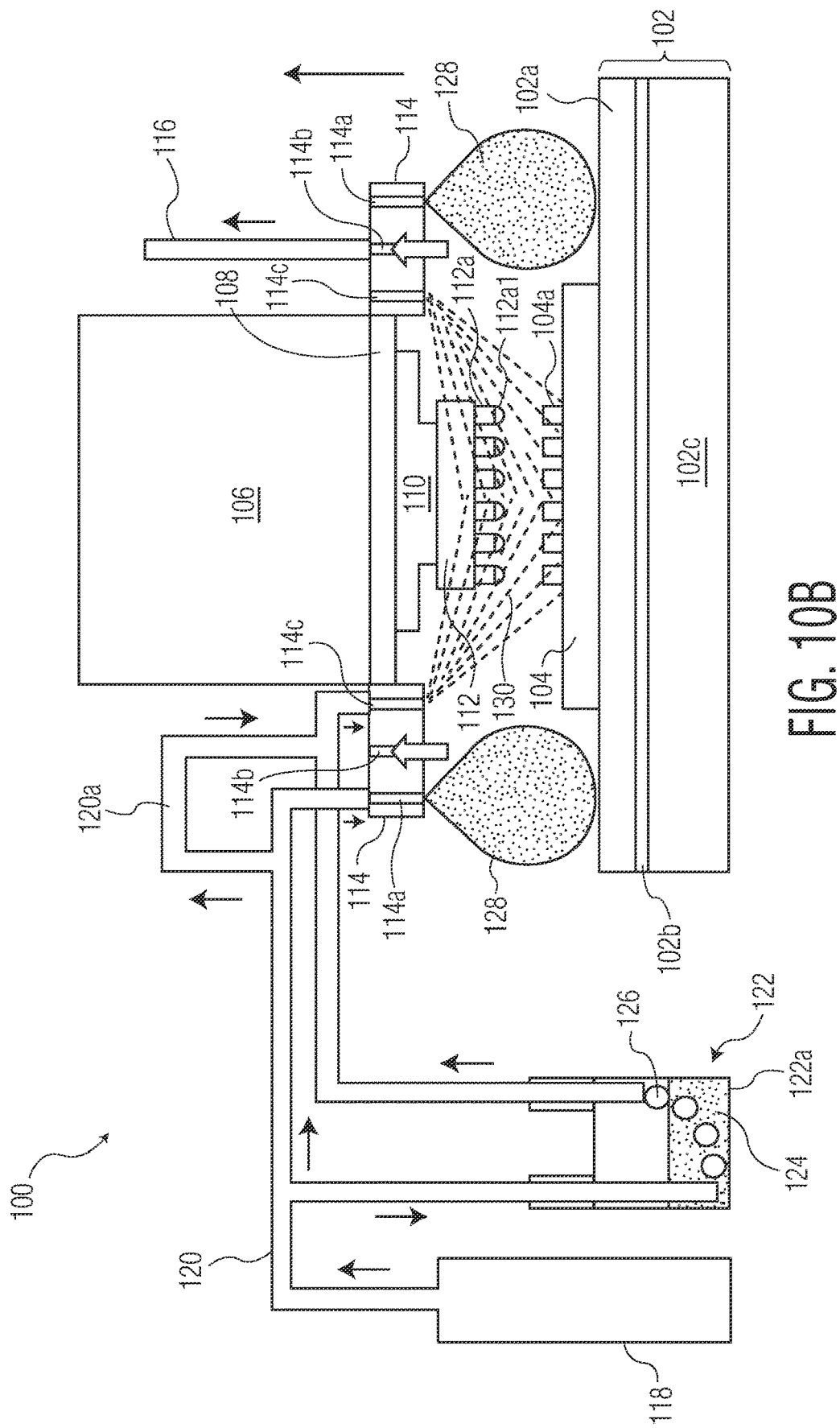
Figure 10C:
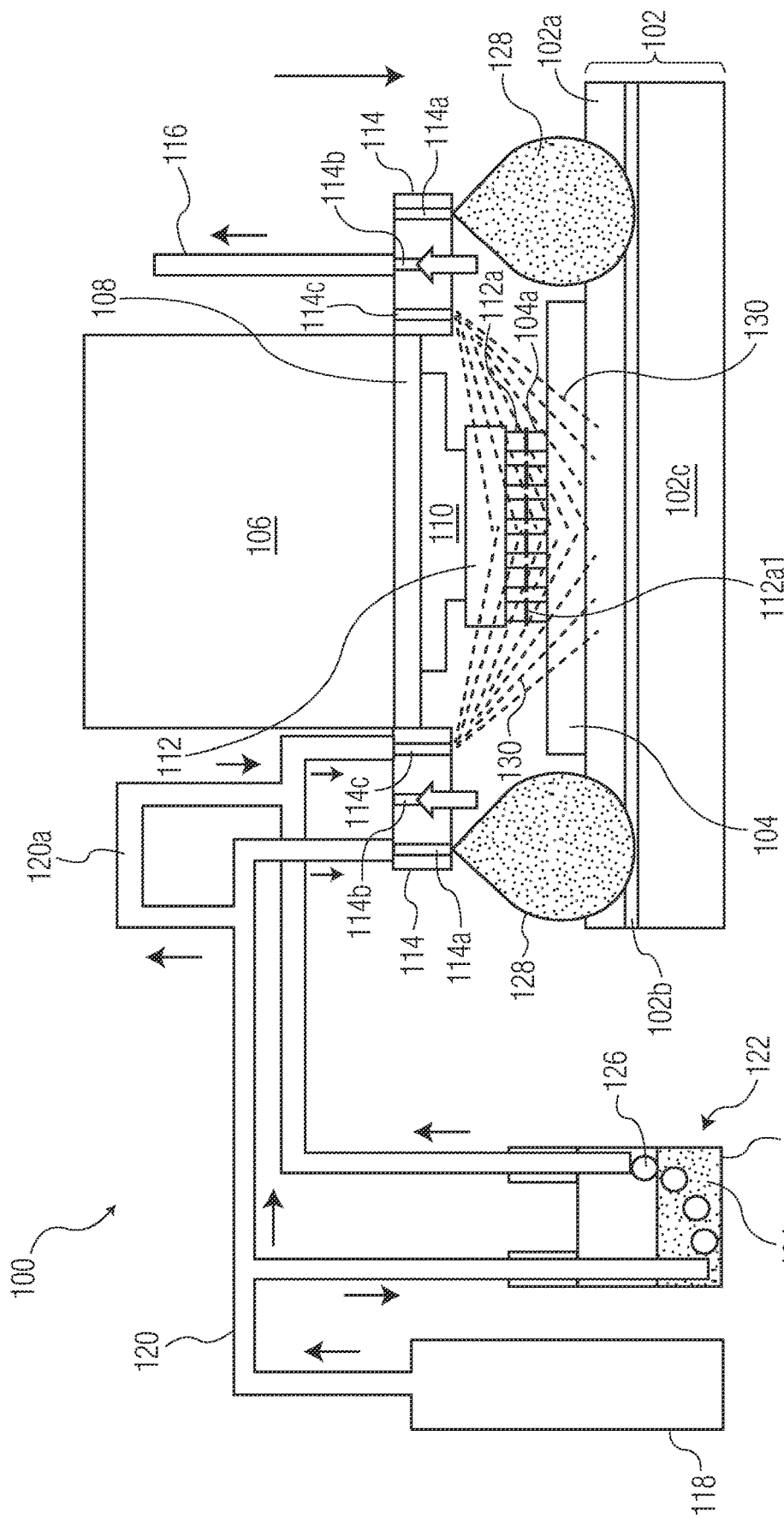
Figure 10D:
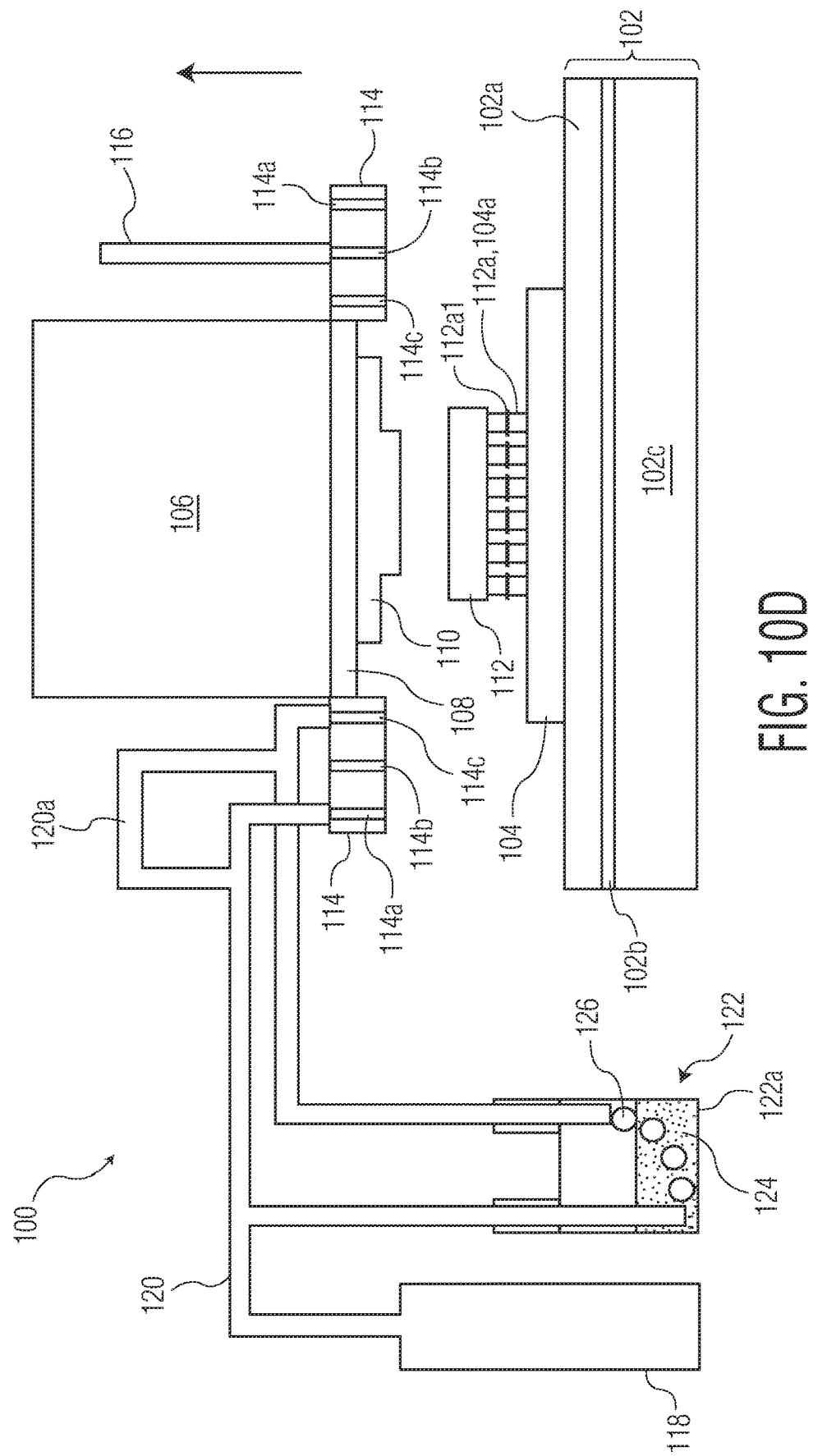

Referring now to FIG. 10A, semiconductor element 112 (carried by bond head 106) is positioned above substrate 104. As shown in FIG. 10B, vapor generation system 122 has been activated to produce reducing gas 130 at the bonding area. More specifically, FIG. 10B illustrates reducing gas 130 being provided at the bonding area, as well as shielding gas 128 being provided, and vacuum being drawn through center channel 114b of bond head manifold 114 via exit piping 116. Thus, the flow of reducing gas 130 reach desired portions of semiconductor element 112 and substrate 104 (e.g., electrically conductive structures 104a and electrically conductive structures 112a) for: removing contaminants from the electrically conductive structures 104a and electrically conductive structures 112a; and/or shielding electrically conductive structures 104a and electrically conductive structures 112a from further potential contamination.

Also shown in FIG. 10B, respective ones of electrically conductive structures 112a (of semiconductor element 112) are aligned with ones of electrically conductive structures 104a (of substrate 104). At FIG. 10C, the process proceeds to a bonding step (e.g., a thermocompression bonding step), for example, through the lowering of bond head 106. That is, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106). At FIG. 10D, the bonding process has been completed. That is, semiconductor element 112 has been bonded to substrate 104, such that corresponding electrically conductive structures 112a, 104a are now bonded to one another with deformed solder material 112a1 provided therebetween.

Although FIGS. 10A-10D (and FIGS. 4-9) illustrate manifold 114, integrated with the bond head, for: delivering the reducing gas; delivering the shielding gas; and providing vacuum—the invention is not limited thereto. For example, instead of such functions being provided through integration of a manifold with the bond head assembly, such functions may be provided through integration with a support structure for supporting the substrate. Further, such functions may be split between the bond head assembly and the support structure (and possibly other structures of the bonding machine). FIGS. 11A-11D are a series of block diagrams of a bonding machine 100", with certain similar elements and functions to that illustrated and described with respect to FIG. 4 and FIGS. 10A-10D, except that the manifold functions (delivering the reducing gas; delivering the shielding gas; and providing vacuum) are integrated into a support structure 202.

Figure 11A:
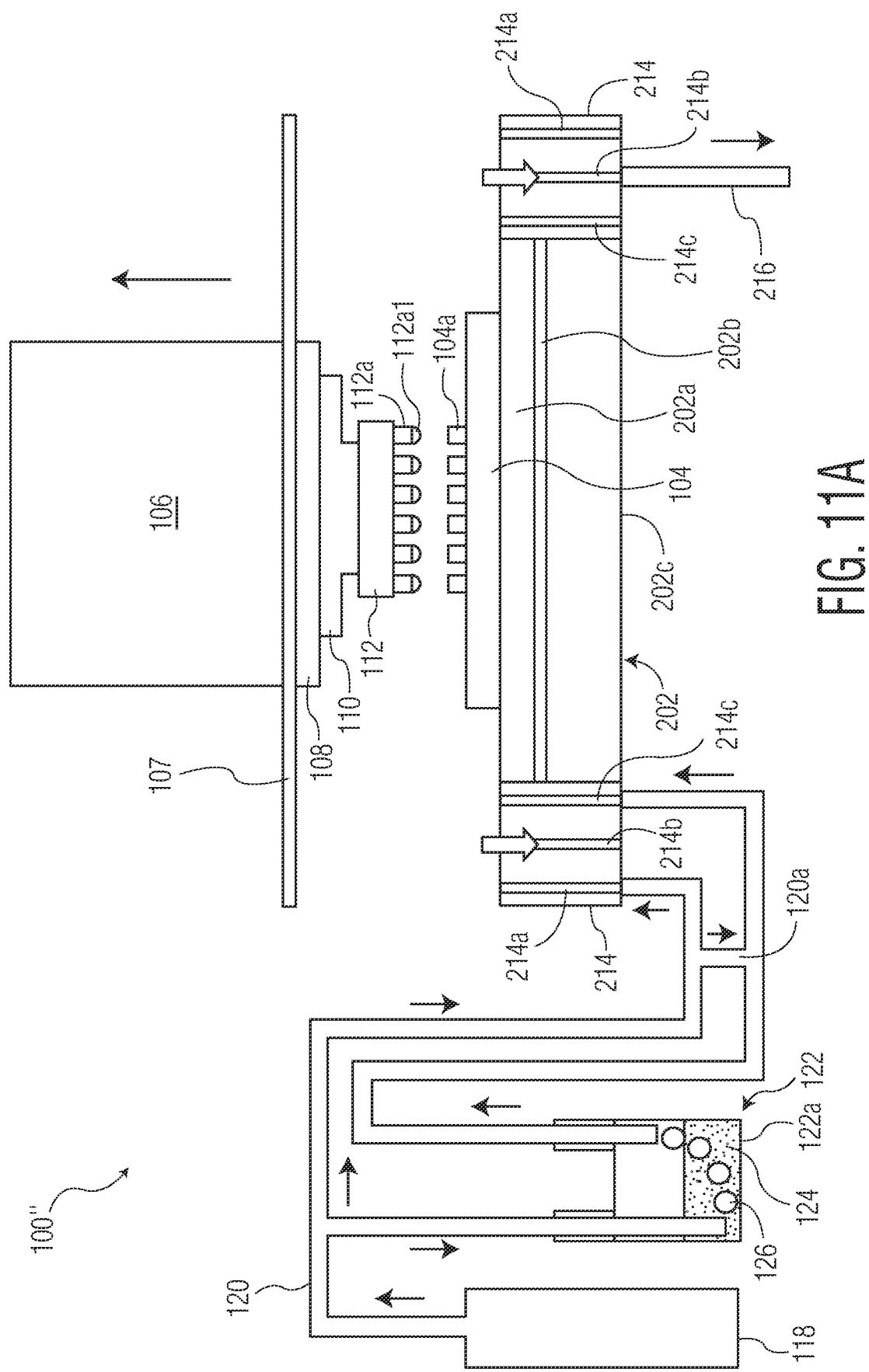

FIG. 11A illustrates bonding machine 100" (e.g., a flip chip bonding machine, a thermocompression bonding machine, etc.). Bonding machine 100" includes a support structure 202 for supporting a substrate 104 during a bonding operation (where substrate 104 includes a plurality of electrically conductive structures 104a). Support structure 202 may include any appropriate structure for the specific application. In FIGS. 11A-11D, support structure 202 includes top plate 202a (configured to directly support substrate 104), chuck 202c, and heater 202b disposed therebetween. In applications where heat for heating substrate 104 is desirable in connection with the bonding operation, a heater such as heater 202b may be utilized.

FIG. 11A also illustrates bond head assembly 106 (including heater 108 and bonding tool 110), which may be configured to move along (and about) a plurality of axes of bonding machine 100" such as, for example, the x-axis, y-axis, z-axis, theta (rotative) axis, etc. In FIG. 11A, bond head assembly 106 carries a plate 107 for partially containing at least one of shielding gas 128 and reducing gas 130 (see description below).

As opposed to a bond head manifold 114 carried by bond head assembly 106 (as in FIGS. 10A-10D), FIGS. 11A-11I illustrate a manifold 214 carried by, and/or intergrated with, support structure 202. Manifold 214 is configured for receiving and distributing fluids (e.g., gases, vapors, etc.) as desired in the given application. In FIG. 11A, while manifold 214 is illustrated in a cross sectional view, the actual manifold 214 at least partially surrounds substrate 104. Of course, manifold 214 may have different configurations from that shown in FIG. 11A. Further, it is understood that certain details of manifold 214 (e.g., interconnection with piping 120, structural details for distributing reducing gas 130 within manifold 214, structural details for distributing shielding gas 128 within manifold 214, structural details for drawing a vacuum through a center channel of manifold 214, etc.) are omitted for simplicity.

Manifold 214 includes three channels 214a, 214b, 214c having different functions. Outer channel 214a receives shielding gas 128 (e.g., nitrogen gas) from shielding gas supply 118 via piping 120. From outer channel 214a of manifold 214, shielding gas 128 is provided as a shield from the outside environment (e.g., see FIGS. 11B-11C). Inner channel 214c receives a reducing gas 130 (e.g., see FIGS. 11B-11C) (e.g., where the reducing gas is a saturated vapor gas) via piping 120, and provides reducing gas 130 in the area of semiconductor element 112 and substrate 104 in connection with a bonding operation. Reducing gas 130 is provided by a vapor generation system 122, but initiates as reducing gas 126 (e.g., see description above with respect to FIG. 4). After reducing gas 130 is distributed in the area of semiconductor element 112 and substrate 104, reducing gas 130 contacts surfaces of each of electrically conductive structures 104a and electrically conductive structures 112a. The surfaces of electrically conductive structures 104a/112a may then include a reaction product (e.g., where the reaction product is provided as a result of: (i) a surface oxide on electrically conductive structures 104a/112a, and (ii) reducing gas from reducing gas 130 (and possibly heat provided by heater 108, if desired). This reaction product is desirably removed from the bonding area (i.e., the area where electrically conductive structures 112a of semiconductor element 112 are bonded to corresponding electrically conductive structures 104a of substrate 104) using vacuum provided through center channel 214b of manifold 214 via exit piping 216.

Thus, FIG. 11A illustrates: (i) various elements of bonding machine 100"; (ii) a path of carrier gas from carrier gas supply 118 to outer channel 214a of manifold 214; (iii) a path of reducing gas 126 (which may receive additional carrier gas from piping 120a) from vapor generation system 122 to inner channel 214c of manifold 214, where it is released to the bonding area as reducing gas 130; and (iv) a path of gas (which may carry away a reaction product from surfaces of electrically conductive structures 104a/112a) drawn by vacuum through center channel 214b of manifold 214. The aforementioned paths are illustrated in FIG. 11A through various arrows even though gas is not flowing in FIG. 11A.

Figure 11B:
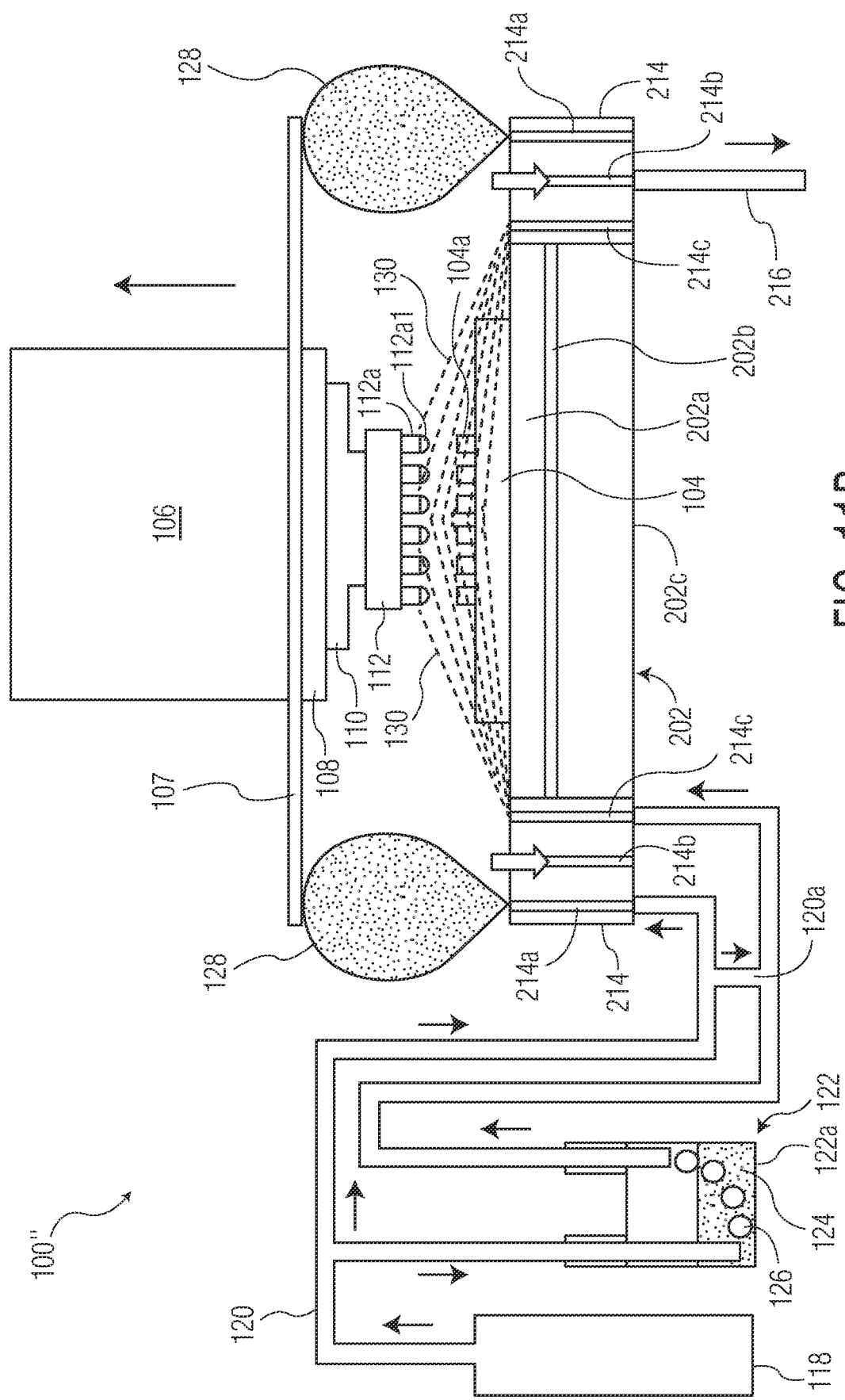
Figure 11C:
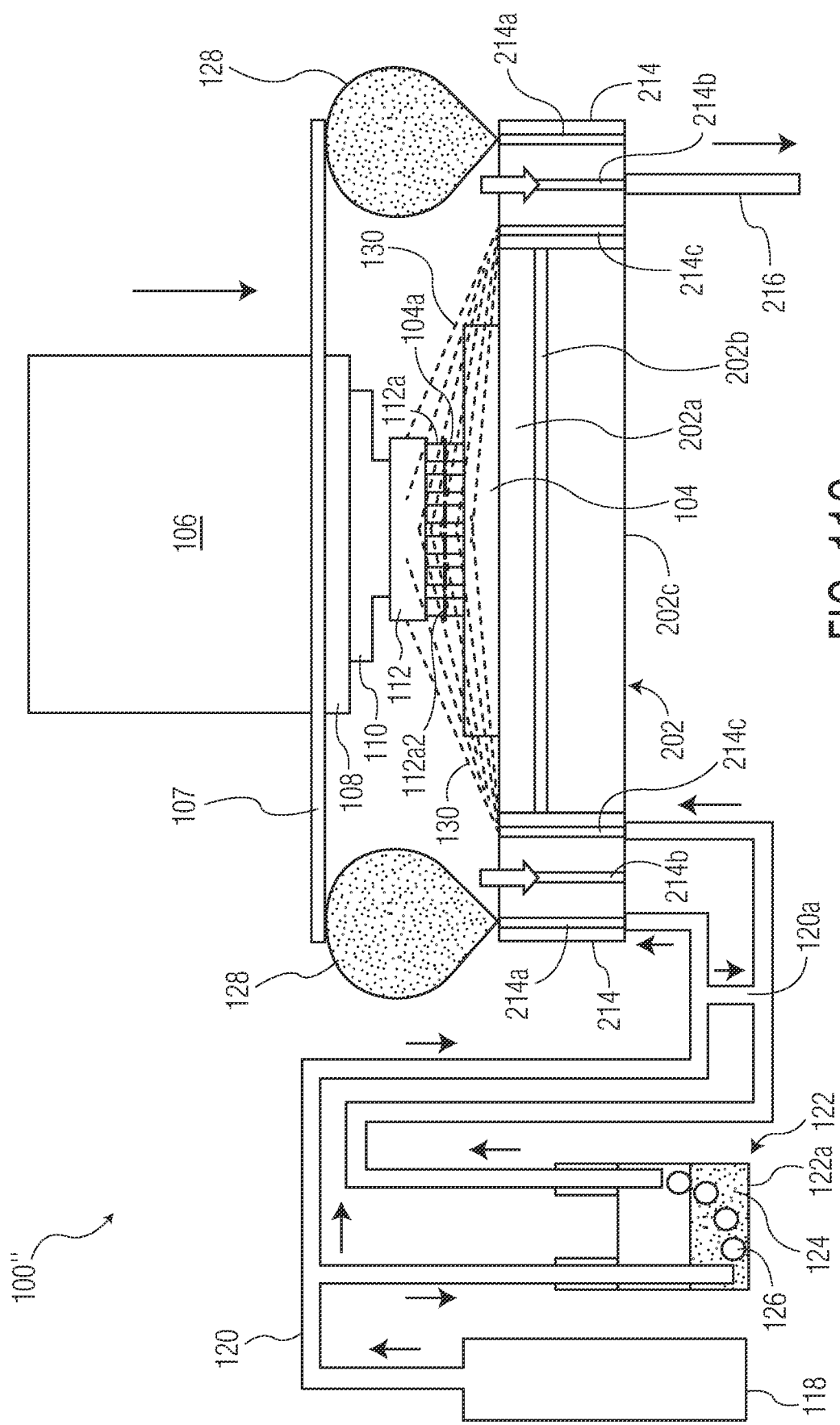

Referring now to FIG. 11A, semiconductor element 112 (carried by bond head 106) is positioned above substrate 104. As shown in FIG. 11B, vapor generation system 122 has been activated to produce reducing gas 130 at the bonding area. More specifically, FIG. 11B illustrates reducing gas 130 being provided at the bonding area, as well as shielding gas 128 being provided, and vacuum being drawn through center channel 114b of bond head manifold 114 via exit piping 116. Thus, the flow of reducing gas 130 reach desired portions of semiconductor element 112 and substrate 104 (e.g., electrically conductive structures 104a and electrically conductive structures 112a) for: removing contaminants from the electrically conductive structures 104a and electrically conductive structures 112a; and/or shielding electrically conductive structures 104a and electrically conductive structures 112a from further potential contamination.

Also shown in FIG. 11B, respective ones of electrically conductive structures 112a (of semiconductor element 112) are aligned with ones of electrically conductive structures 104a (of substrate 104). At FIG. 11C, the process proceeds to a bonding step (e.g., a thermocompression bonding step), for example, through the lowering of bond head 106. That is, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106). At FIG. 11D, the bonding process has been completed. That is, semiconductor element 112 has been bonded to substrate 104, such that corresponding electrically conductive structures 112a, 104a are now bonded to one another with deformed solder material 112a2 provided therebetween.

Although the invention has been illustrated primarily with respect to one of manifolds 114, 214 for directing (i) the flow of reducing gas 130, (ii) the flow of shielding gas 128, and (iii) the pull of the vacuum, it is understood that the structure used to direct the flow patterns may be different from that illustrated. That is, the configuration of the structure used to provide and direct fluids 130, 128 (and to draw vacuum) may vary considerably from that shown.

The invention described herein in connection with FIGS. 4-9, FIGS. 10A-10D, and FIGS. 11A-11D may provide a number of benefits such as, for example: fluxless bonding (e.g., no fluxing of the semiconductor element or the substrate is required prior to or during bonding); reduction of oxides on both the semiconductor element and the substrate; among others.

It will be appreciated by those skilled in the art that certain elements of bonding machine 100 (see FIGS. 4-9 and FIGS. 10A-10D), and/or bonding machine 100" (see FIGS. 11A-11D) may be integrated into the systems of FIGS. 1A-1D, FIGS. 2A-2P, and FIGS. 3A-3B, to replace at least a portion of the elements of the bondhead compartments (e.g., the bond head, the shroud, certain piping, etc.).

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the claims and without departing from the invention.

What is claimed is:

1. A bonding system for bonding a semiconductor element to a substrate, the bonding system comprising:
   a substrate oxide prevention chamber configured to receive a substrate, the substrate including a plurality of first electrically conductive structures, the substrate oxide prevention chamber having an inert environment when receiving the substrate;
   a reducing gas delivery system for providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures;
   a bond head including a bonding tool for bonding the semiconductor element to the substrate, the reducing gas delivery system being integrated with the bond head; and
   a substrate support structure, the substrate support structure supporting the substrate during bonding of the semiconductor element to the substrate.

2. The bonding system of claim 1 further comprising a substrate transfer system for transferring the substrate to the substrate oxide prevention chamber.

3. The bonding system of claim 1 wherein the substrate oxide prevention chamber is provided with nitrogen to create the inert environment.

4. The bonding system of claim 1 further comprising a material handling system for moving the substrate within the substrate oxide prevention chamber.

5. The bonding system of claim 1 wherein the substrate oxide prevention chamber includes a bonding location for receiving the substrate during bonding of the semiconductor element to the substrate.

6. The bonding system of claim 1 further comprising another chamber housing at least a portion of (i) the substrate oxide prevention chamber and (ii) the reducing gas delivery system.

7. The bonding system of claim 6 further comprising an exhaust system for pulling exhaust from the another chamber.

8. A method of bonding a semiconductor element to a substrate, the method comprising the steps of:
   (a) moving a substrate into a substrate oxide prevention chamber, the substrate including a plurality of first electrically conductive structures, the substrate oxide prevention chamber having an inert environment when receiving the substrate;
   (b) providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures; and
   (c) bonding the semiconductor element to the substrate using (i) a bond head including a bonding tool for bonding the semiconductor element to the substrate and (ii) a reducing gas delivery system, the substrate being supported by a support structure during bonding of the semiconductor element to the substrate, the reducing gas delivery system being integrated with the bond head.

9. The method of claim 8 wherein step (a) includes moving the substrate from a substrate source to the substrate oxide prevention chamber.

10. The method of claim 9 wherein step (a) further includes moving the substrate from the substrate source to the substrate oxide prevention chamber using a substrate transfer system.

11. The method of claim 8 further comprising providing the inert environment to the substrate oxide prevention chamber using nitrogen.

12. The method of claim 8 further comprising moving the substrate through the substrate oxide prevention chamber with a material handling system.

13. The method of claim 8 further comprising bonding the semiconductor element to the substrate at a bonding location in the substrate oxide prevention chamber.

14. The method of claim 8 further comprising bonding the semiconductor element to the substrate at a portion of bond sites of the substrate.

15. A bonding system for bonding a semiconductor element to a substrate, the bonding system comprising:
   a substrate oxide prevention chamber configured to receive a substrate, the substrate including a plurality of first electrically conductive structures, the substrate oxide prevention chamber having an inert environment when receiving the substrate;
   a reducing gas delivery system for providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures;
   a bond head including a bonding tool for bonding the semiconductor element to the substrate; and
   a substrate support structure, the substrate support structure supporting the substrate during bonding of the semiconductor element to the substrate, the reducing gas delivery system being integrated with the substrate support structure.

16. The bonding system of claim 15 further comprising a substrate transfer system for transferring the substrate to the substrate oxide prevention chamber.

17. The bonding system of claim 15 wherein the substrate oxide prevention chamber is provided with nitrogen to create the inert environment.

18. The bonding system of claim 15 further comprising a material handling system for moving the substrate within the substrate oxide prevention chamber.

19. The bonding system of claim 15 wherein the substrate oxide prevention chamber includes a bonding location for receiving the substrate during bonding of the semiconductor element to the substrate.

20. The bonding system of claim 15 further comprising another chamber housing at least a portion of (i) the substrate oxide prevention chamber and (ii) the reducing gas delivery system.

21. The bonding system of claim 20 further comprising an exhaust system for pulling exhaust from the another chamber.

22. A method of bonding a semiconductor element to a substrate, the method comprising the steps of:
   (a) moving a substrate into a substrate oxide prevention chamber, the substrate including a plurality of first electrically conductive structures, the substrate oxide prevention chamber having an inert environment when receiving the substrate;

(b) providing a reducing gas environment during bonding of a semiconductor element to the substrate, the semiconductor element including a plurality of second electrically conductive structures, the plurality of first electrically conductive structures being configured to be bonded with corresponding ones of the plurality of second electrically conductive structures; and (c) bonding the semiconductor element to the substrate using (i) a bond head including a bonding tool for bonding the semiconductor element to the substrate and (ii) a reducing gas delivery system, the substrate being supported by a support structure during bonding of the semiconductor element to the substrate, the reducing gas delivery system being integrated with the support structure.

23. The method of claim 22 wherein step (a) includes moving the substrate from a substrate source to the substrate oxide prevention chamber.

24. The method of claim 23 wherein step (a) further includes moving the substrate from the substrate source to the substrate oxide prevention chamber using a substrate transfer system.

25. The method of claim 22 further comprising providing the inert environment to the substrate oxide prevention chamber using nitrogen.

26. The method of claim 22 further comprising moving the substrate through the substrate oxide prevention chamber with a material handling system.

27. The method of claim 22 further comprising bonding the semiconductor element to the substrate at a bonding location in the substrate oxide prevention chamber.

28. The method of claim 22 further comprising bonding the semiconductor element to the substrate at a portion of bond sites of the substrate.

* * * * *